United States Patent
Chu et al.

(10) Patent No.: US 11,626,485 B2
(45) Date of Patent: Apr. 11, 2023

(54) FIELD EFFECT TRANSISTOR AND METHOD

(71) Applicant: Taiwan Semiconductor Manufacturing Co., Ltd., Hsinchu (TW)

(72) Inventors: Lung-Kun Chu, Hsinchu (TW); Mao-Lin Huang, Hsinchu (TW); Chung-Wei Hsu, Hsinchu (TW); Jia-Ni Yu, Hsinchu (TW); Kuo-Cheng Chiang, Hsinchu (TW); Kuan-Lun Cheng, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 135 days.

(21) Appl. No.: 17/070,717

(22) Filed: Oct. 14, 2020

(65) Prior Publication Data

US 2022/0115498 A1 Apr. 14, 2022

(51) Int. Cl.
| | |
|---|---|
| *H01L 29/06* | (2006.01) |
| *H01L 27/092* | (2006.01) |
| *H01L 21/8234* | (2006.01) |
| *H01L 29/78* | (2006.01) |
| *H01L 29/66* | (2006.01) |

(52) U.S. Cl.
CPC .. *H01L 29/0669* (2013.01); *H01L 21/823431* (2013.01); *H01L 27/0924* (2013.01); *H01L 29/66795* (2013.01); *H01L 29/785* (2013.01)

(58) Field of Classification Search
CPC ......... H01L 29/0669; H01L 21/823431; H01L 27/0924; H01L 29/66795; H01L 29/785; H01L 27/088; H01L 29/401; H01L 29/42364; H01L 29/42392; H01L 29/66439; H01L 29/775; H01L 29/0673; H01L 21/823807; H01L 21/823821; H01L 27/092; H01L 29/78696; B82Y 10/00
See application file for complete search history.

(56) References Cited

U.S. PATENT DOCUMENTS

| | | | |
|---|---|---|---|
| 9,236,267 B2 | 1/2016 | De et al. | |
| 9,502,265 B1 | 11/2016 | Jiang et al. | |
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 2020/0027791 A1* | 1/2020 | Loubet | H01L 29/165 |

* cited by examiner

*Primary Examiner* — Cuong B Nguyen
(74) *Attorney, Agent, or Firm* — Seed IP Law Group LLP

(57) ABSTRACT

A device includes a substrate, and a first semiconductor channel over the substrate. The first semiconductor channel includes a first nanosheet of a first semiconductor material, a second nanosheet of a second semiconductor material in physical contact with a topside surface of the first nanosheet, and a third nanosheet of the second semiconductor material in physical contact with an underside surface of the first nanosheet. The first gate structure is over and laterally surrounding the first semiconductor channel, and in physical contact with the second nanosheet and the third nanosheet.

20 Claims, 21 Drawing Sheets

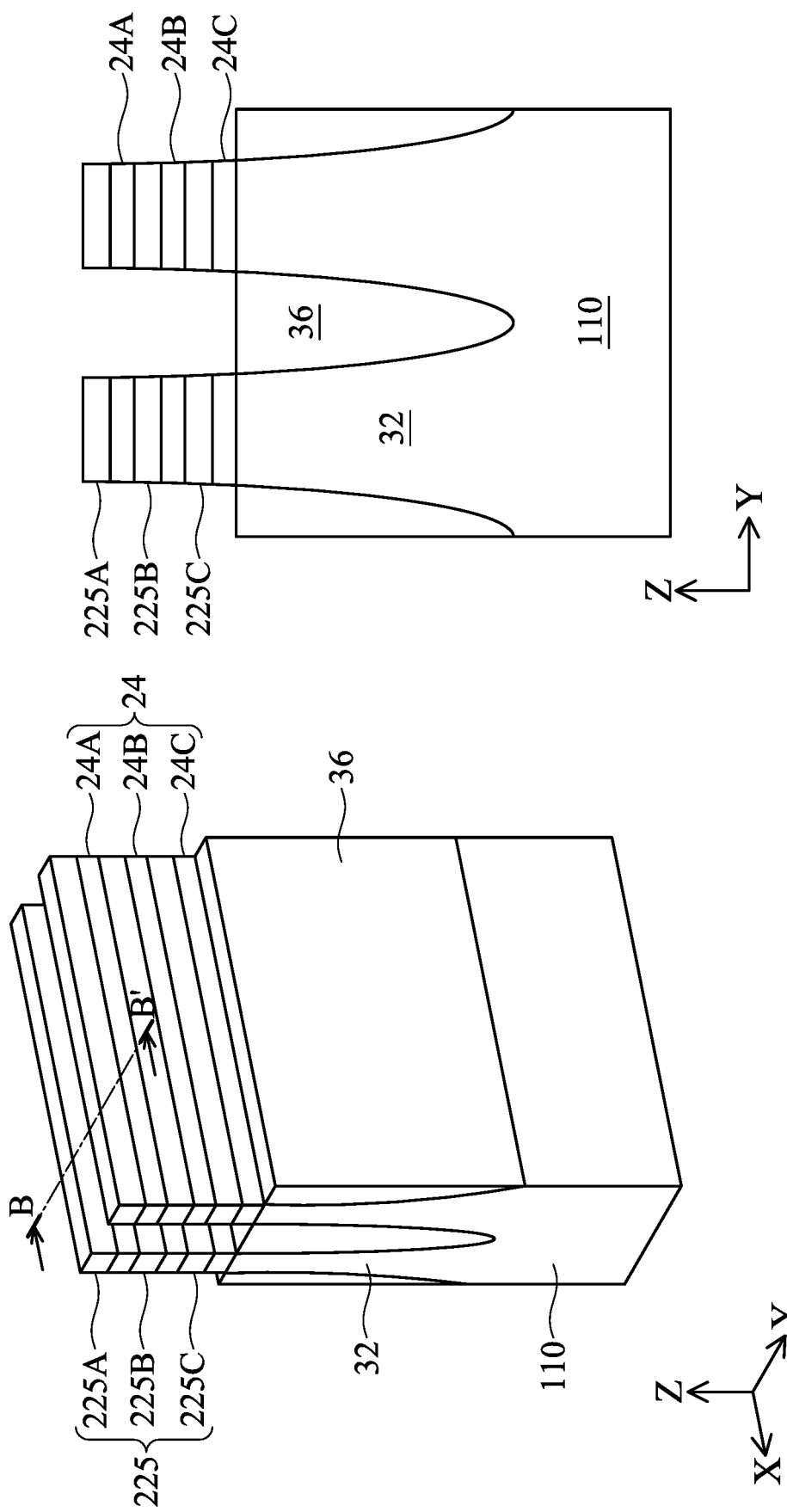

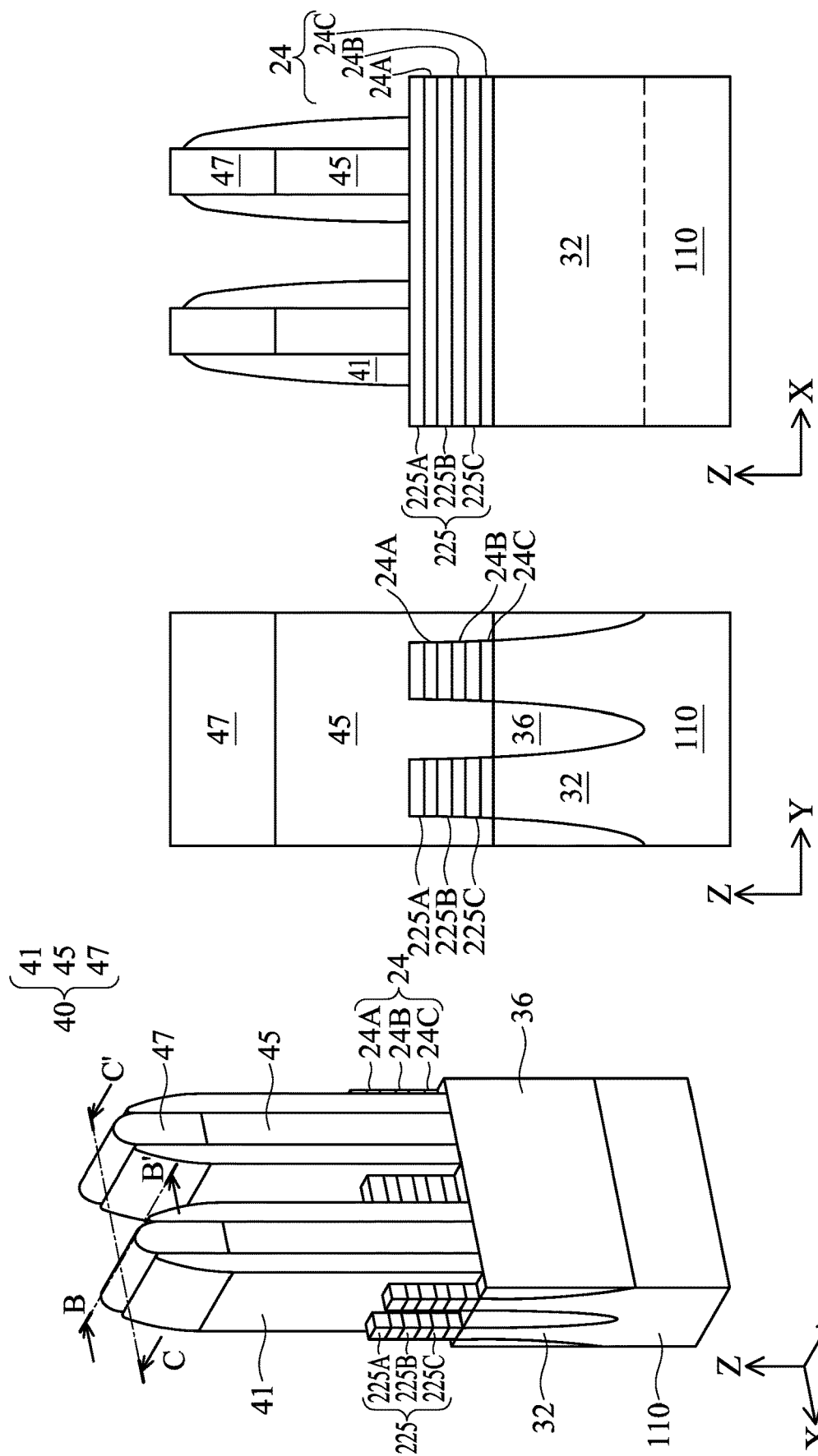

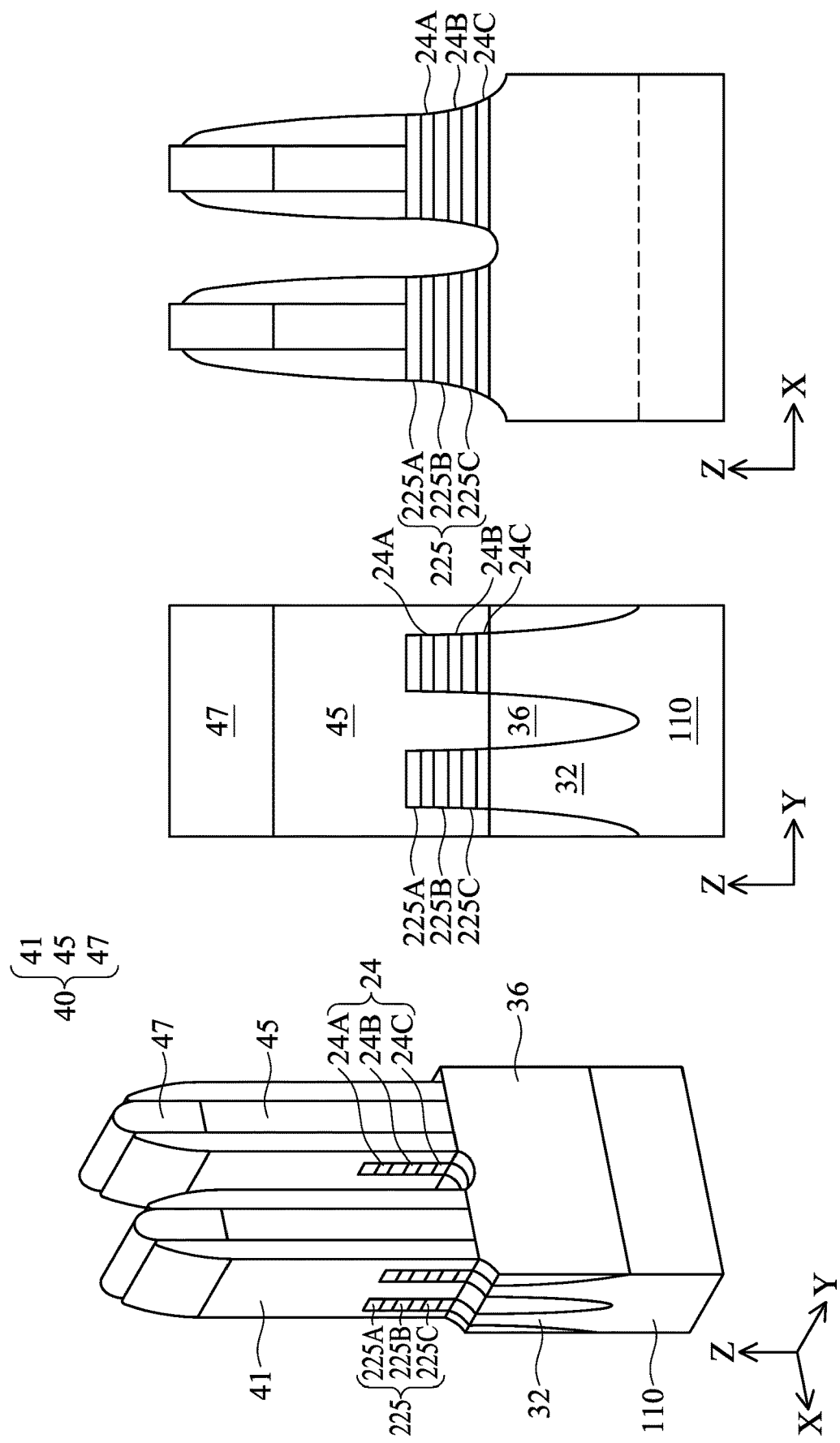

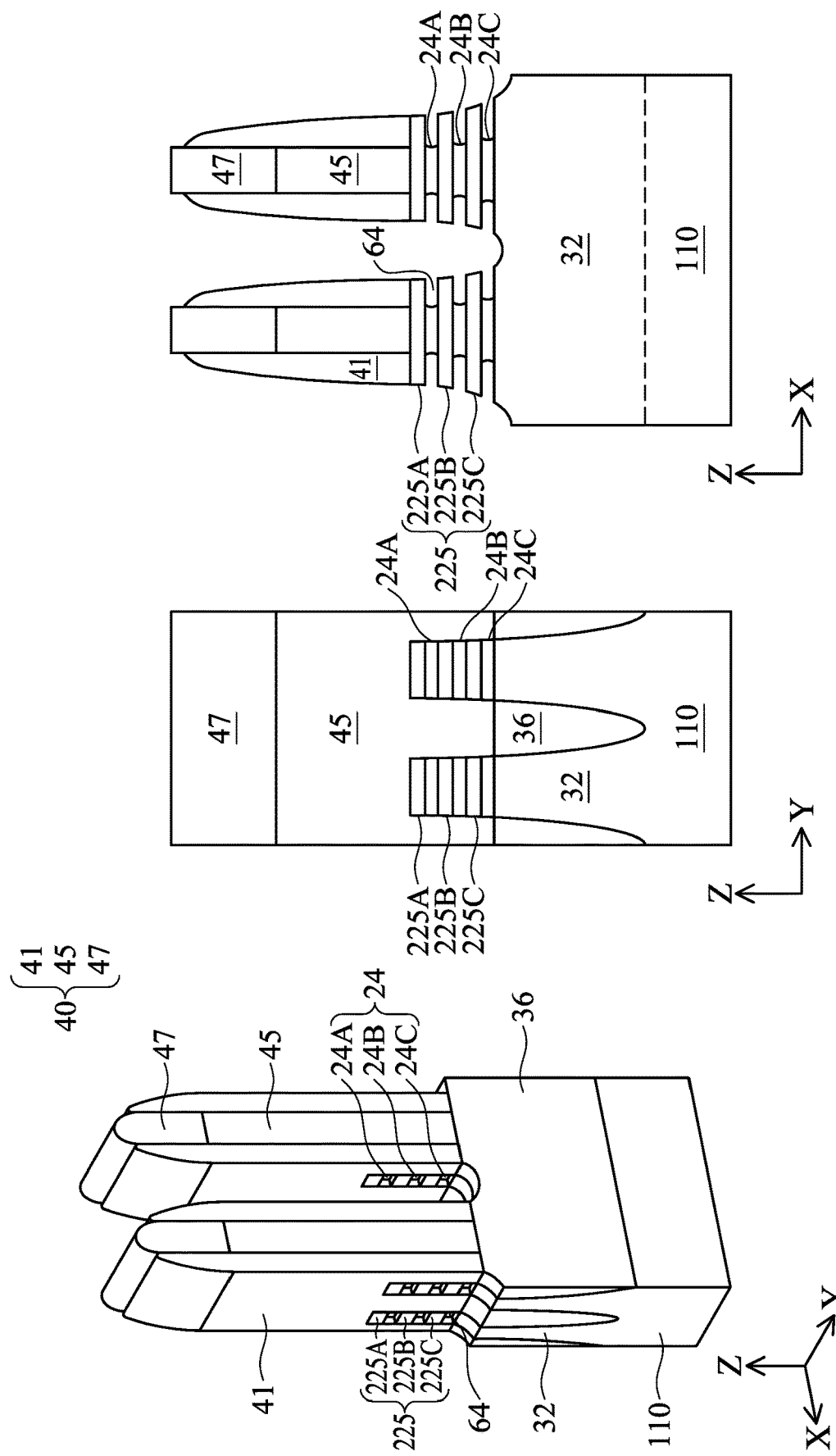

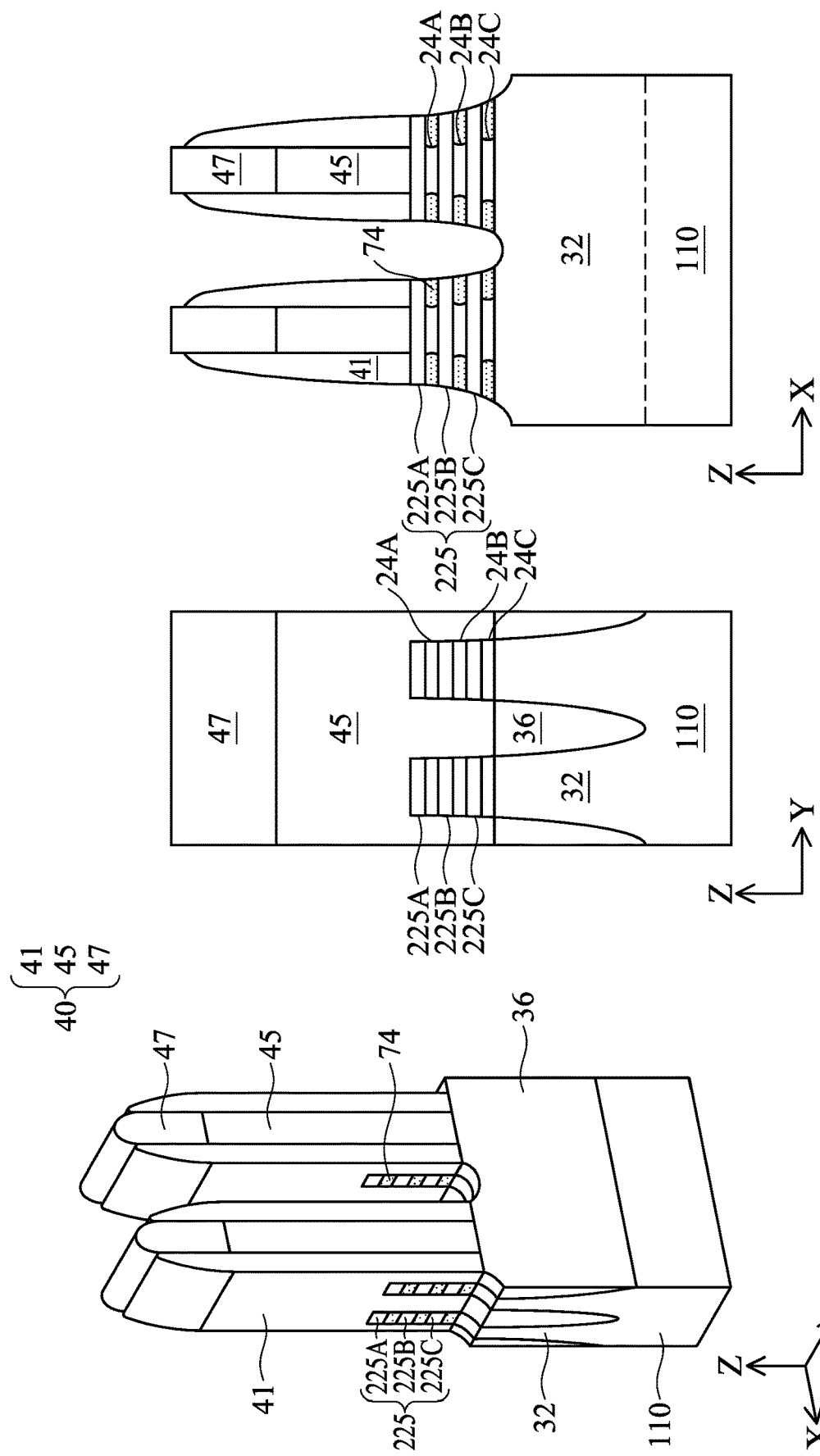

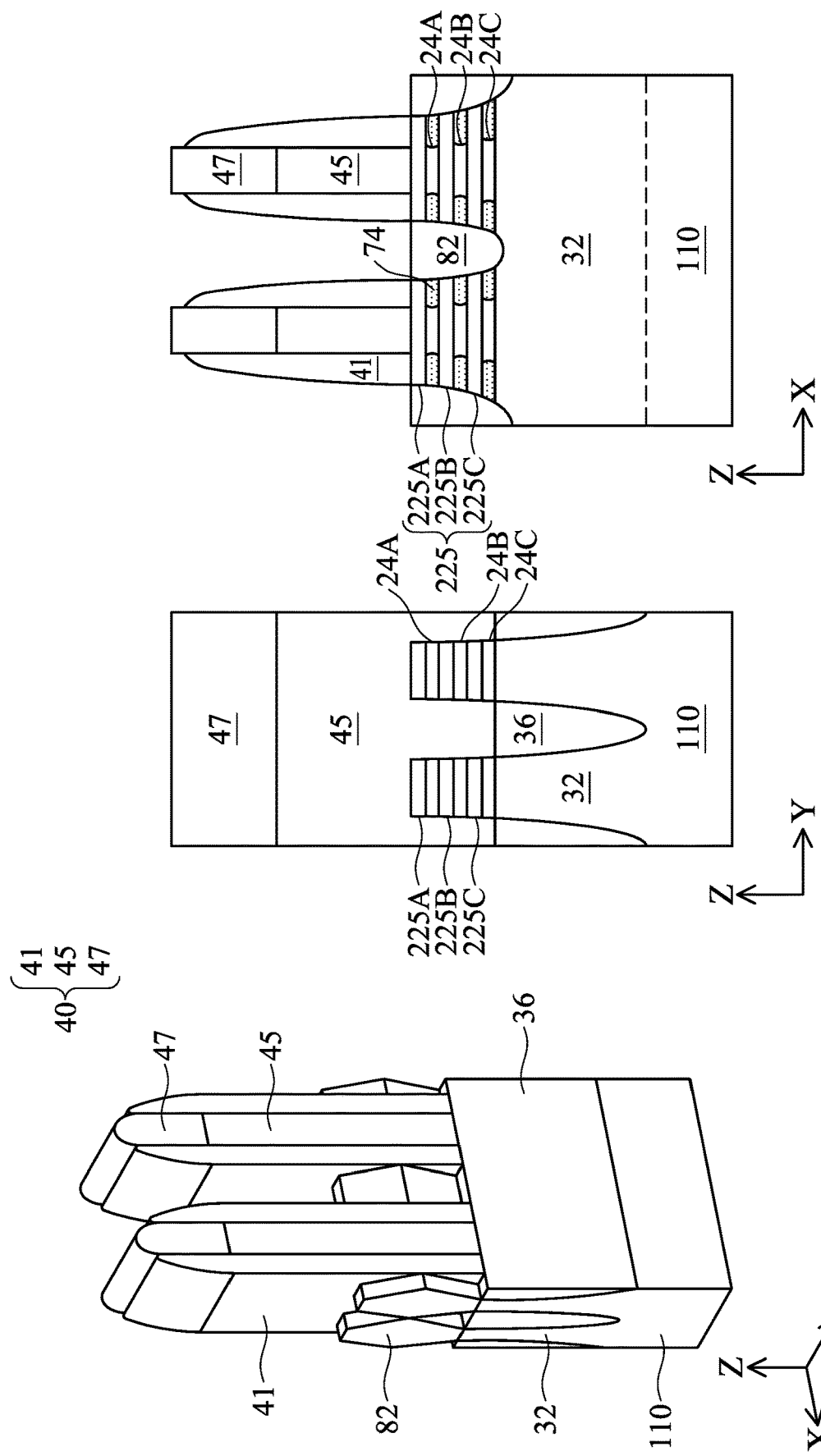

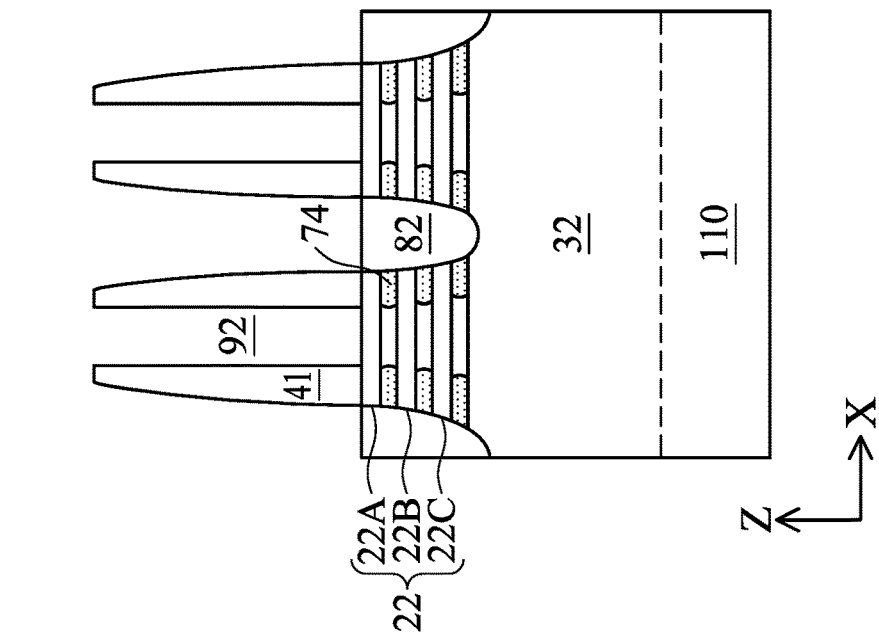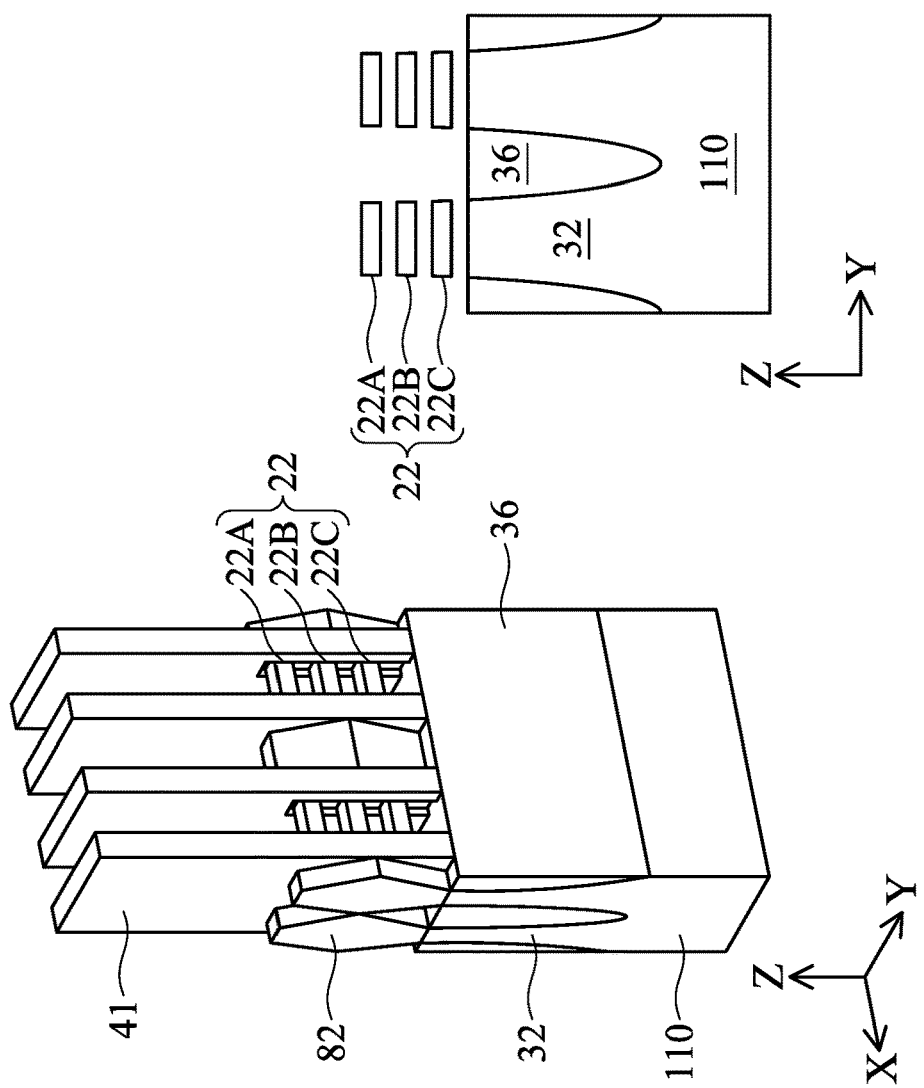

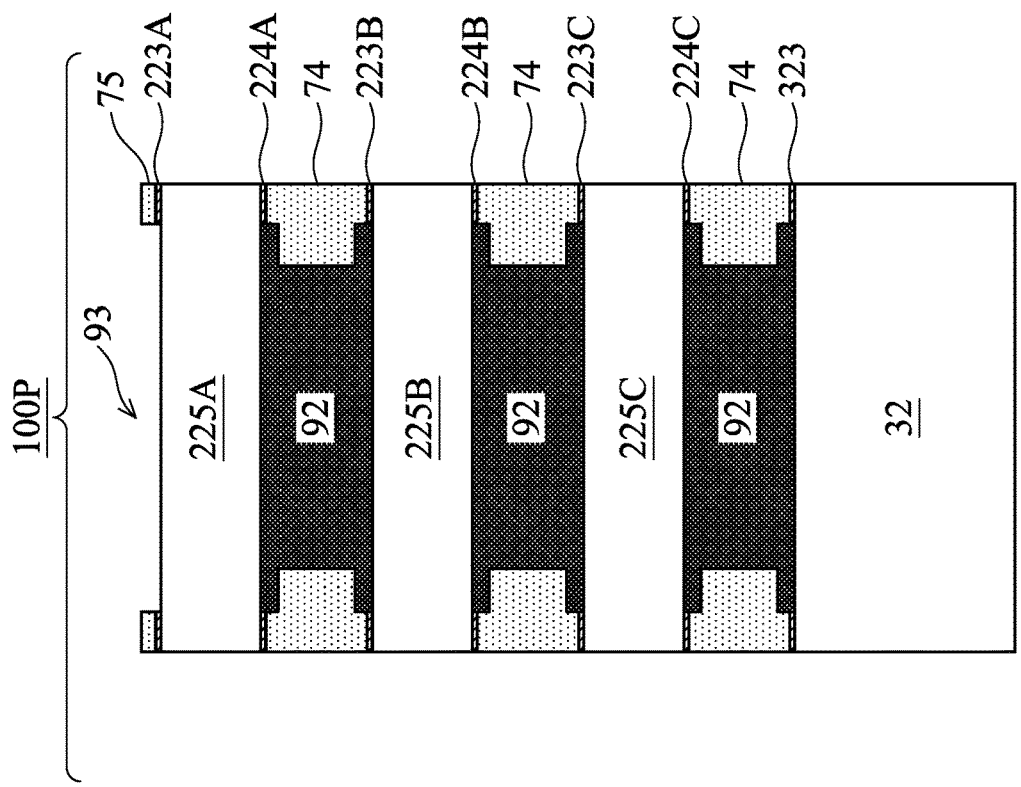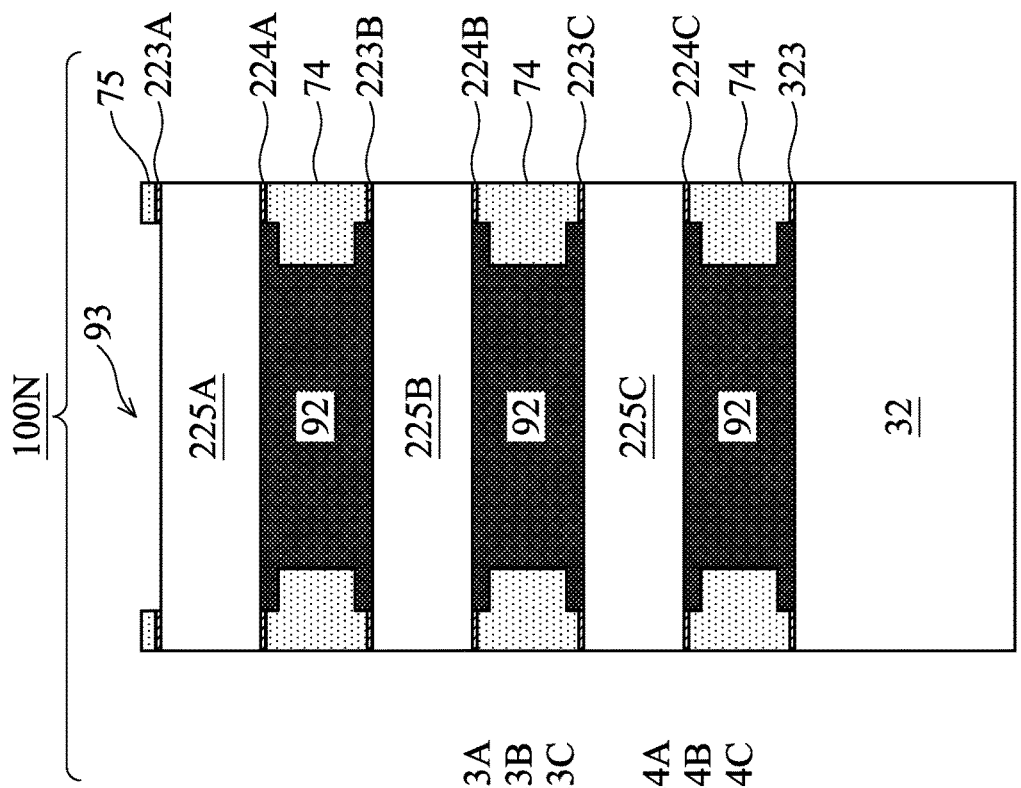
FIG. 9D

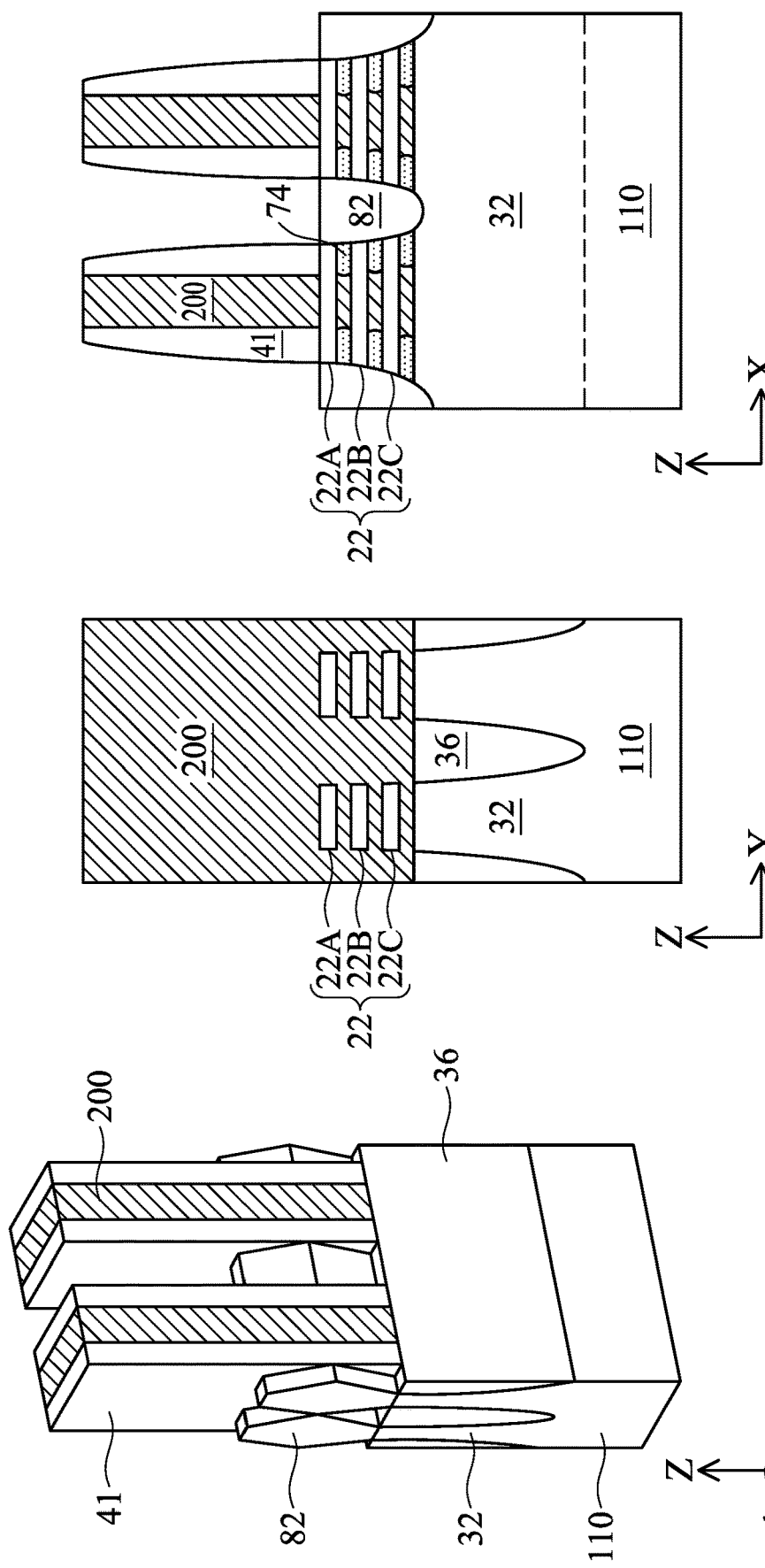

FIELD EFFECT TRANSISTOR AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Metal oxide semiconductor (MOS) field effect transistors (FETs), or "MOSFETs," can be considered voltage-controlled current sources. In a MOSFET, a gate terminal overlies or surrounds a semiconductor channel which conducts charged carriers between a source region and a drain region abutting the semiconductor channel. Voltage at the gate terminal (or "gate voltage") causes the semiconductor channel to become conductive when the gate voltage is above a certain threshold (or "threshold voltage"). As such, the threshold voltage of a MOSFET is the minimum gate-to-source voltage (or source-to-gate voltage) that is needed to create a conducting path between the source and drain regions.

The threshold voltage is closely related to many MOSFET performance characteristics. For example, different functional transistors may benefit from a variety of threshold voltages. An input-output (IO) transistor may benefit from a high threshold voltage, which allows for driving a large number of external circuits or circuits that are relatively distant from the IO transistors. A core logic transistor may benefit from a low threshold voltage, which allows for faster switching, lower power consumption and/or lower heat generation. As such, greater IC complexity and functional density have led to a greater variety of threshold voltages in a single IC chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-10F are views of various embodiments of an IC device of at various stages of fabrication according to various aspects of the present disclosure.

DETAILED DESCRIPTION

Figure 1:
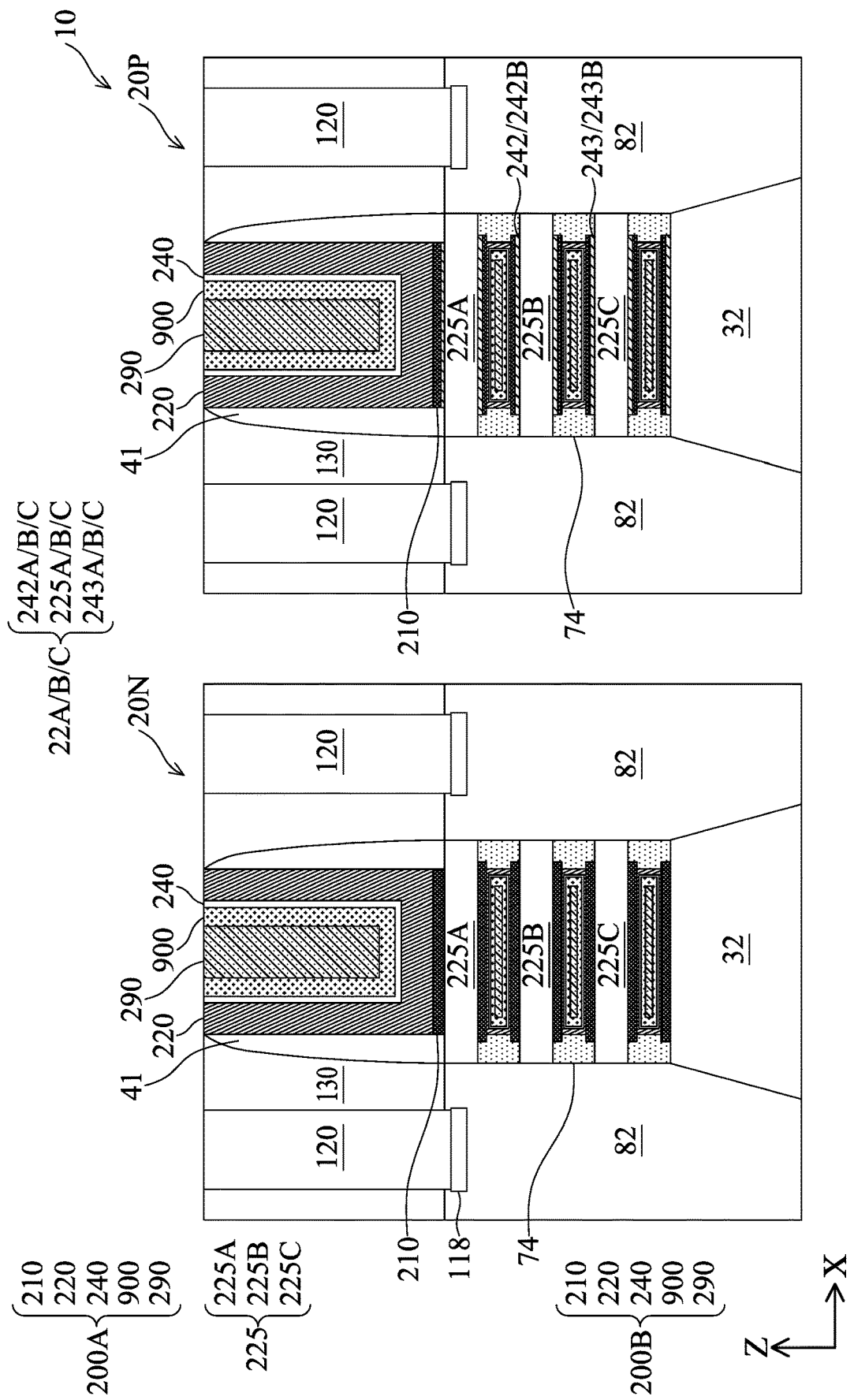
FIG. 1 is a diagrammatic cross-sectional side view of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms. For example, about may indicate variation in a dimension of 20%, 10%, 5% or the like, but other values may be used when appropriate. A large feature, such as the longest dimension of a semiconductor fin may have variation less than 5%, whereas a very small feature, such as thickness of an interfacial layer may have variation of as much as 50%, and both types of variation may be represented by the term "about." "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

The present disclosure is generally related to semiconductor devices, and more particularly to field-effect transistors (FETs), such as planar FETs, three-dimensional fin-line FETs (FinFETs), or gate-all-around (GAA) FETs. Different threshold voltages ("Vt") of the semiconductor devices are desirable to optimize performance of circuit elements having widely different functional requirements. Performance enhancement and power reduction are highly desirable for advanced technology nodes, such that GAA nanosheet (NS) devices have attracted more attention for better gate control and higher performance. However, silicon-channel-based nanosheet devices, in which the silicon channel is usually formed (or "released") by removal of adjacent SiGe layers, also called "sheet formation" (SHF), have generally suffered from lower mobility and higher threshold voltage due to complexity in the production process. One example is germanium residue which may be present on the silicon channels post sheet formation, which leads to lower mobility and performance.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In a typical GAA NS device, a semiconductor lattice including alternating layers of Si and SiGe is formed, after which the SiGe layers are removed to form the Si nanosheets, or simply "nanosheets." In processes with thermal budget, germanium from the SiGe nanosheets, which generally employ a high germanium concentration to ensure breakthrough during release, intermixes with the Si nanosheets, which leads to substantial germanium residue after sheet formation, even in the presence of high etching selectivity. Germanium in or on the nanosheet tends to increase threshold voltage in absolute terms, e.g., shifting threshold voltage in the positive direction by some significant amount. For an N-type FET (NFET), the positive shift corresponds to an increase in magnitude of the threshold voltage. For a P-type FET (PFET), which typically has a threshold voltage that is a negative value, the positive shift corresponds to a decrease in magnitude of the threshold voltage.

An improved semiconductor lattice is disclosed herein which employs a multi-layer SiGe nanosheet structure between the Si nanosheets to provide selective inclusion/exclusion of SiGe material from the Si nanosheet. A middle layer of the SiGe nanosheet includes a high Ge concentration (atomic % as much as 40% in some embodiments), which ensures sheet formation breakthrough during removal. Side layers, such as a top layer and a bottom layer overlying and underlying the middle layer, respectively, include a lower Ge concentration (atomic % as little as 10% in some embodiments), which reduces intermixing between the silicon of the Si nanosheets and the germanium of the SiGe nanosheet structures during thermal processes, such as annealing. Following sheet formation, most or all remaining SiGe from the side layers may be removed by a trimming process, such as a SiGe oxidation process followed by oxide removal. As such, the Si nanosheets are formed substantially free of germanium, which allows for higher mobility and performance. In some embodiments, a portion or the entirety of each side layer is intentionally left on the Si nanosheets, which can give the added benefit of lowering threshold voltage magnitude for certain P-type FETs or increasing the threshold voltage magnitude of certain N-type FETs, thereby providing an additional lever for threshold voltage tuning.

FIG. 1 illustrates a diagrammatic cross-sectional side view of a portion of an IC device 10 fabricated according to embodiments of the present disclosure, where the IC device 10 includes gate-all-around (GAA) devices 20N, 20P. The GAA devices 20N, 20P may include at least an NFET or a PFET in some embodiments. For example, the GAA device 20N is an NFET, and the GAA device 20P is a PFET, in accordance with some embodiments. Integrated circuit devices such as the IC device 10 frequently include transistors having different threshold voltages based on their function in the IC device. High-performance, core logic transistors typically have the lowest threshold voltages (magnitude) to achieve higher switching speeds at lower operating power. Input/output (IO) transistors typically have the highest threshold voltages due to the high current handling required of the IO transistors. Other threshold voltages between that of the IO transistors and that of the core logic transistors may also be employed for certain other functional transistors, such as static random access memory (SRAM) transistors. Some functional circuit blocks within the IC device 10 may include two or more NFETs and/or PFETs of two or more different threshold voltages.

The cross-sectional view of the IC device 10 in FIG. 1 is taken along an X-Z plane, where the X-direction is the horizontal direction, and the Z-direction is the vertical direction. The GAA devices 20N, 20P each include channels 22A-22C (alternately referred to as "nanostructures") over a fin structure 32. The channels 22A-22C are laterally abutted by source/drain features 82, and covered and surrounded by gate structures 200A, 200B. The gate structures 200A, 200B control flow of electrical current through the channels 22A-22C based on voltages applied at the gate structures 200A, 200B and at the source/drain features 82. The threshold voltage is a minimum voltage (e.g., gate-source voltage or source-gate voltage) needed to establish a conducting path in the channels 22A-22C. Threshold voltage enhancement and/or tuning during fabrication of the various transistors, e.g., IO transistors, core logic transistors, and SRAM transistors, preferably with low modification of the fabrication process, is accomplished by at least one of the techniques applied during fabrication of the gate structures 200A, 200B, described in greater detail below.

In some embodiments, the fin structure 32 includes silicon. In some embodiments, the GAA device 20N is an NFET, and the source/drain features 82 thereof include silicon phosphorous (SiP). In some embodiments, the GAA device 20P is a PFET, and the source/drain features 82 thereof include silicon germanium (SiGe).

The channels 22A-22C each include a semiconductive material, for example silicon or a silicon compound, such as silicon germanium, or the like. The channels 22A-22C have nanostructures (e.g., having sizes that are in a range of a few nanometers) and may also each have an elongated shape and extend in the X-direction. In some embodiments, the channels 22A-22C each have a nanowire (NW) shape, a nanosheet (NS) shape, a nanotube (NT) shape, or other suitable nanoscale shape. The cross-sectional profile of the channels 22A-22C may be rectangular, round, square, circular, elliptical, hexagonal, or combinations thereof. In most embodiments, the channels 22A-22C include silicon nanosheets.

In some embodiments, the lengths (e.g., measured in the X-direction) of the channels 22A-22C may be different from each other, for example due to tapering during a fin etching process. In some embodiments, length of the channel 22A may be less than a length of the channel 22B, which may be less than a length of the channel 22C. The channels 22A-22C each may not have uniform thickness, for example due to a channel trimming process used to expand spacing (e.g., measured in the Z-direction) between the channels 22A-22C to increase gate structure fabrication process window. For example, a middle portion of each of the channels 22A-22C may be thinner than the two ends of each of the channels 22A-22C. Such shape may be collectively referred to as a "dog-bone" shape.

In some embodiments, each of the channels 22A-22C is simply the nanosheet 225A-225C, respectively, such as is illustrated in the GAA device 20N. In some embodiments, each of the channels 22A-22C may further include a low-concentration silicon germanium (SiGe) layer 242 on a topside and/or a low-concentration SiGe layer 243 on an underside of each of the silicon nanosheets 225A-225C. In some embodiments, topsides of the fins 32 also include low-concentration SiGe layers 242. For example, as shown in FIG. 1, the GAA device 20P, which may be a PFET core logic transistor, includes the low-concentration SiGe layers 242, 243 on topsides and/or undersides of the silicon nanosheets 225A-225C, and the topside of the fin 32, respectively. The low-concentration SiGe layers 242, 243 reduce the threshold voltage (magnitude) in PFETs, e.g., by shifting the threshold voltage in the positive voltage direction, which may be desirable for core logic transistors, which generally employ very low threshold voltages. In the preceding description, reference to topside generally indicates a side of a structure most distant from the major surface of the substrate on which the structure is formed, and reference to underside generally indicates a side of the structure nearest the major surface of the substrate. For example, in the GAA device 20P, the low-concentration SiGe layer 242B is on the topside of the nanosheet 225B of the GAA device 20P, and the low-concentration SiGe layer 243B is on the underside of the nanosheet 225B.

In some embodiments, the low-concentration SiGe layers 242, 243 include germanium at atomic percentage in a range of about 10% to about 25%. As such, each low-concentration SiGe layer 242, 243 may be $Si_{1-x}Ge_x$ that includes about 10% to about 25% (0.1<x<0.25) Ge in molar ratio. Concentration of germanium may be substantially constant within each of the low-concentration SiGe layers 242, 243. In some embodiments, the concentration has variation less than about 10% along the height (Z-direction) of the low-concentration SiGe layer 242, 243. This may be due to formation of the low-concentration SiGe layers 242, 243 through an epitaxial process rather than through intermixing between the SiGe nanosheets 23 and the silicon nanosheets 21 (FIGS. 2A-2C) or the SiGe nanosheets 24 and the silicon nanosheets 22 (FIGS. 3A-3C) that would occur in a thermal process, such as an anneal, in conventional approaches.

In some embodiments, the spacing between nanosheets 225A-225C of the channels 22A-22C (e.g., between the nanosheet 225B and the nanosheet 225A or the nanosheet 225C) is in a range between about 7 nanometers (nm) and about 13 nm. In some embodiments, a thickness (e.g., measured in the Z-direction) of each of the nanosheets 225A-225C is in a range between about 4 nm and about 8 nm. In some embodiments, a width (e.g., measured in the Y-direction, not shown in FIG. 1, orthogonal to the X-Z plane) of each of the nanosheets 225A-225C is at least about 8 nm. In some embodiments, a thickness (e.g., measured in the Z-direction) of the low-concentration SiGe layers 242, 243 is in a range of about 0.5 nm to about 2 nm. In some embodiments, the thickness of the nanosheets 225 is greater than the thickness of each of the low-concentration SiGe layers 242, 243 by a multiple in a range of about 2 to about 16. The multiple being less than about 2 means that the combined thickness of the low-concentration SiGe layers 242, 243 is greater than the thickness of the nanosheet 225 in the channel 22, which is undesirable due to performance of the channel 22 being dominated by the material of the low-concentration SiGe layers 242, 243 rather than the nanosheet 225. The multiple being greater than about 16 may cause insufficient isolation between the nanosheet 225 and a high-concentration SiGe layer 231, 241 (see FIG. 2C and FIG. 3C), such that heavy intermixing of Ge and Si occurs near the top and bottom surfaces of the nanosheet 225.

In some embodiments, the spacing between the nanosheets is greater than the thickness of each of the low-concentration SiGe layers 242, 243 by a multiple in a range of about 3.5 to about 26. The multiple being less than about 3.5 may impinge upon gate fill window. The multiple being greater than 26 may cause insufficient isolation between the nanosheet 225 and a high-concentration SiGe layer 231, 241 (see FIG. 2C and FIG. 3C), such that heavy intermixing of Ge and Si occurs near the top and bottom surfaces of the nanosheet 225.

In some embodiments, thickness of the channels 22A-22C of the GAA device 20P, is in a range between about 5 nm to about 12 nm. In some embodiments, thickness of the channels 22A-22C of the GAA device 20P is not uniform in the X-direction due to the low-concentration SiGe layers 242, 243, such that the thickness of the channels 22A-22C at the peripheries (e.g., vertically between the inner spacers) is in a range between about 4 nm to about 8 nm, and the thickness of the channels 22A-22C between the peripheries is in a range between about 5 nm to about 12 nm.

The channels 22A are uppermost channels of the GAA devices 20N, 20P, most distant from the substrate 110. In some embodiments, the nanosheet 225A of the GAA device 20P is not covered by a SiGe layer structure prior to nanosheet formation. In such embodiments, the topside of the nanosheet 225A of the GAA device 20P may be substantially free of SiGe. As such, the thickness of the channel 22A of the GAA device 20P may be in a range of about 4.5 nm to about 10 nm.

The gate structures 200A, 200B, are disposed over and between the channels 22A-22C, respectively. A first interfacial layer (IL) 210, which may be an oxide of the material of the channels 22A-22C, is formed on exposed areas of the channels 22A-22C and the top surface of the fin 32. The first IL layer 210 promotes adhesion of the gate dielectric layer 220 to the channels 22A-22C. In some embodiments, the first IL layer 210 has thickness of about 5 Angstroms (A) to about 50 Angstroms (A). In some embodiments, the first IL layer 210 has thickness of about 10 A. The first IL layer 210 having thickness that is too thin may exhibit voids or insufficient adhesion properties. The first IL layer 210 being too thick consumes gate fill window.

The gate dielectric layer 220, which may be a multi-layer structure, includes a high-k gate dielectric material in some embodiments, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 220 has thickness of about 5 A to about 50 A, which may be similar to, or somewhat thicker than, the first IL layer 210. In some embodiments, the gate dielectric layer 220 has thickness of about 15 A, or about half again the thickness of the first IL layer 210.

The gate structures 200A, 200B further include one or more work function metal layers, represented collectively as the work function metal layer 900. In the GAA device 20N, which is an NFET in most embodiments, the first work function metal layer 900 may include at least an N-type work function metal layer, an in-situ capping layer, and an oxygen blocking layer. In some embodiments, the first work function metal layer 900 includes more or fewer layers than those described. In the GAA device 20P, which is a PFET in most embodiments, the first work function metal layer 900 may be substantially the same as in the GAA device 20N.

In some embodiments, the gate structures 200A, 200B further include a second IL 240, which promotes better metal gate adhesion on the gate dielectric layer 220, e.g. between the gate dielectric layer 220 and the work function metal layer 900. In many embodiments, the second IL 240 further provides improved thermal stability for the gate structures 200A-200B, and serves to limit diffusion of metallic impurity from the work function metal layers 900 to the gate dielectric layer 220. The second IL 240 may be or comprise TiSiNO, in some embodiments.

The gate structures 200A, 200B also include metal fill layers 290. The metal fill layers 290 may include a conductive material such as tungsten, cobalt, ruthenium, iridium, molybdenum, copper, aluminum, or combinations thereof. Between the channels 22A-22C, the metal fill layers 290 are circumferentially surrounded (in the cross-sectional view) by the one or more work function metal layers 900, which are then circumferentially surrounded by the gate dielectric layer 220. In the portion of the gate structures 200A, 200B formed over the channel 22A most distal from the fin 32, the metal fill layers 290 are formed over the work function metal layer 900. The work function metal layer 900 wraps around the metal fill layer 290. The gate dielectric layer 220 also wraps around the work function metal layer 900. The gate structures 200A, 200B may also include a glue layer that is formed between the work function metal layer 900 and the metal fill layer 290 to increase adhesion. The glue layer is not specifically illustrated in FIG. 1 for simplicity.

Figure 6D:
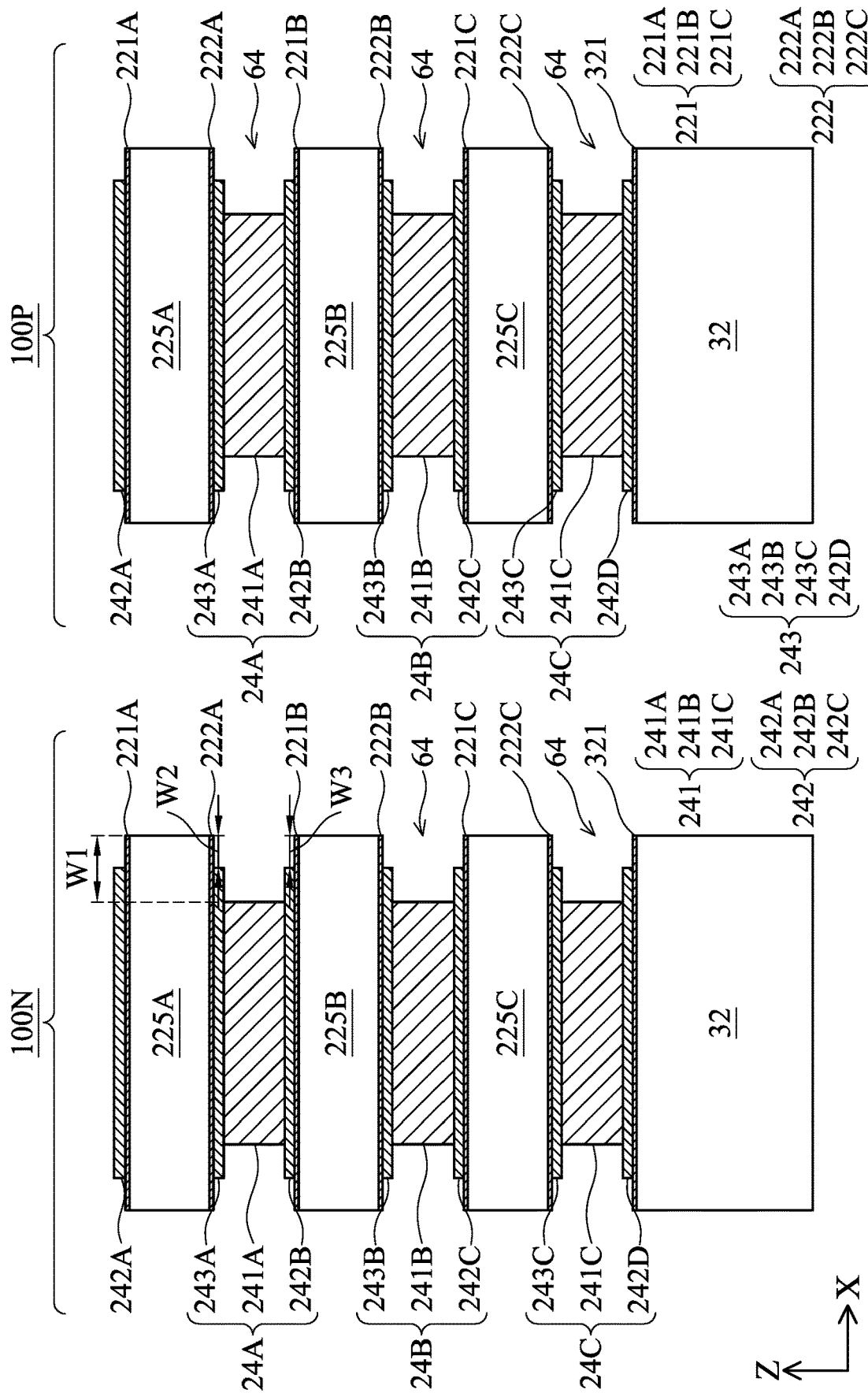

The GAA devices 20N, 20P also include gate spacers 41 and inner spacers 74 that are disposed on sidewalls of the gate dielectric layer 220. The inner spacers 74 are also disposed between the channels 22A-22C. The gate spacers 41 and the inner spacers 74 may include a dielectric material, for example a low-k material such as SiOCN, SiON, SiN, or SiOC. In some embodiments, due to inclusion of the low-concentration SiGe layers 242, 243 prior to nanosheet formation, the inner spacers 74 have notches facing the gate structure 200A or 200B. Formation of notches is described in greater detail in the discussion of FIG. 6D related to channel recessing in preparation for inner spacer formation. Generally, due to inclusion of the low-concentration SiGe layers 242, 243 in the SiGe nanosheets 23 (see FIGS. 2A-2C) between the silicon nanosheets 225A-225C, etch rate of high-concentration SiGe layers 231 (FIG. 2C) is much greater than etch rate of the low-concentration SiGe layers 242, 243, which is in turn much greater than etch rate of the silicon nanosheets 225A-225C, which results in steps between the above layers, as shown in FIG. 6D. When the inner spacers 74 are formed, the inner spacers 74 generally adopt the stepped shape of the openings 64 (FIG. 6D) in which the inner spacers 74 are formed.

The GAA devices 20N, 20P further include source/drain contacts 120 that are formed over the source/drain features 82. The source/drain contacts 120 may include a conductive material such as tungsten, cobalt, ruthenium, iridium, molybdenum, copper, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain features 82 and the source/drain contacts 120, so as to reduce the source/drain contact resistance. The silicide layer 118 may contain a metal silicide material, such as cobalt silicide in some embodiments, or TiSi in some other embodiments.

The GAA devices 20N, 20P further include an interlayer dielectric (ILD) 130. The ILD 130 provides electrical isolation between the various components of the GAA devices 20N, 20P discussed above, for example between the gate structures 200A, 200B and the source/drain contacts 120.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

Figure 11:
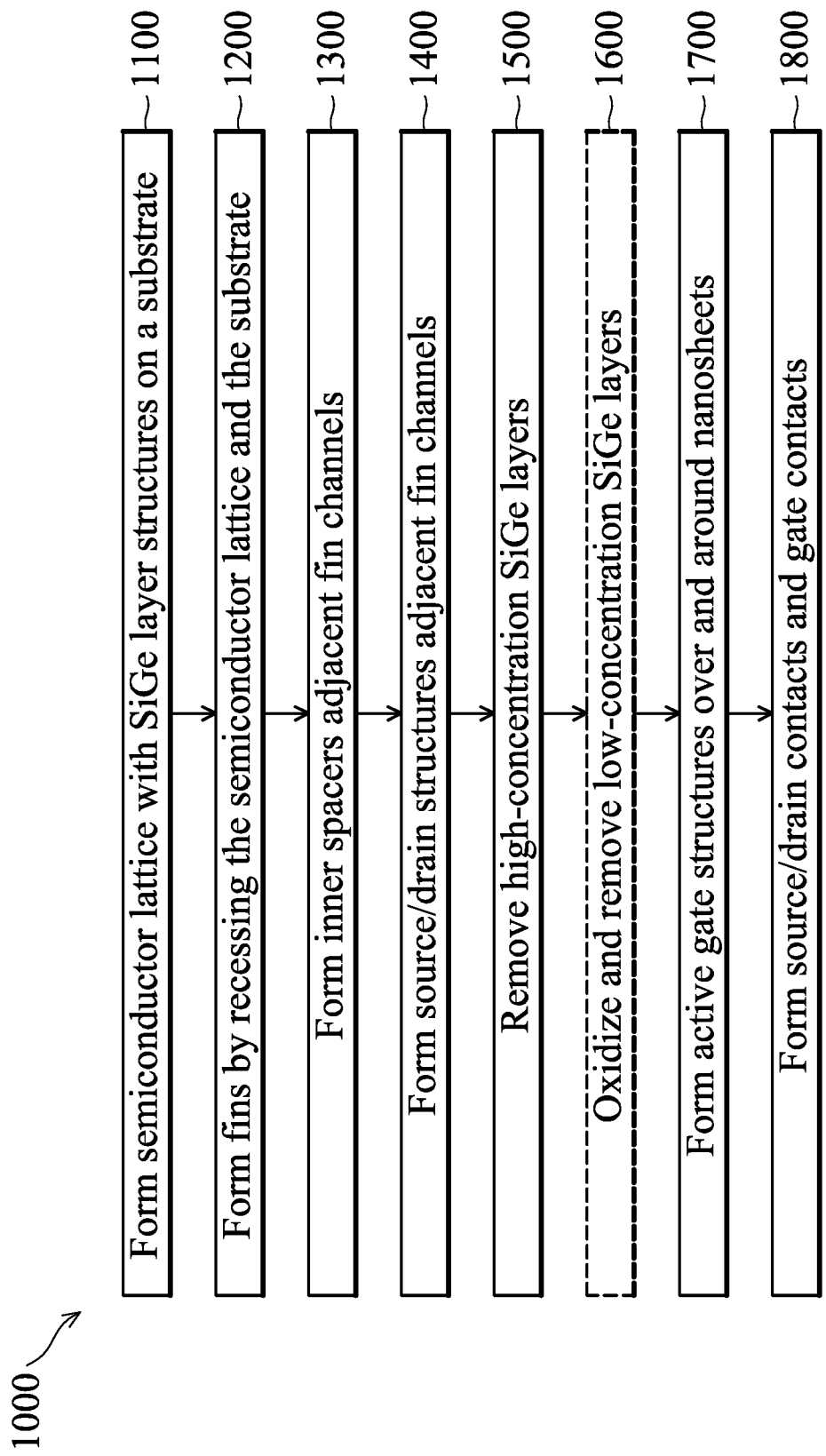
FIG. 11 is a flowchart illustrating a method of fabricating a semiconductor device according to various aspects of the present disclosure.

FIG. 11 illustrates a flowchart illustrating a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary cross-sectional views of a workpiece (shown in FIGS. 2A-2B, 3A-3B, 4A-4C, 5A-5C, 6A-6C, 7A-7C, 8A-8C, 9A-9C, and 10A-10C) at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 10F are perspective views and cross-sectional views of intermediate stages in the manufacturing of nano-FETs, in accordance with some embodiments. FIGS. 2A, 3A, 4A, 5A, 6A, 7A, 8A, 9A, and 10A illustrate perspective views. FIGS. 2B, 3B, 4B, 5B, 6B, 7B, 8B, 9B, and 10B illustrate reference cross-section B-B' (gate cut) illustrated in FIGS. 2A, 3A, and 4A. FIGS. 4C, 5C, 6C, 7C, 8C, 9C, and 10C illustrate reference cross-section C-C' (channel/fin cut) illustrated in FIG. 4A. FIGS. 2C and 3C illustrate enlarged cross-sectional views along cross-sectional line B-B' illustrated in FIGS. 2A, 3A and 4A. FIGS. 6D, 7D, 9D, 9E, 9F, 10D, 10E and 10F illustrate enlarged cross-sectional views along cross-sectional line C-C' illustrated in FIG. 4A.

Figure 2B:
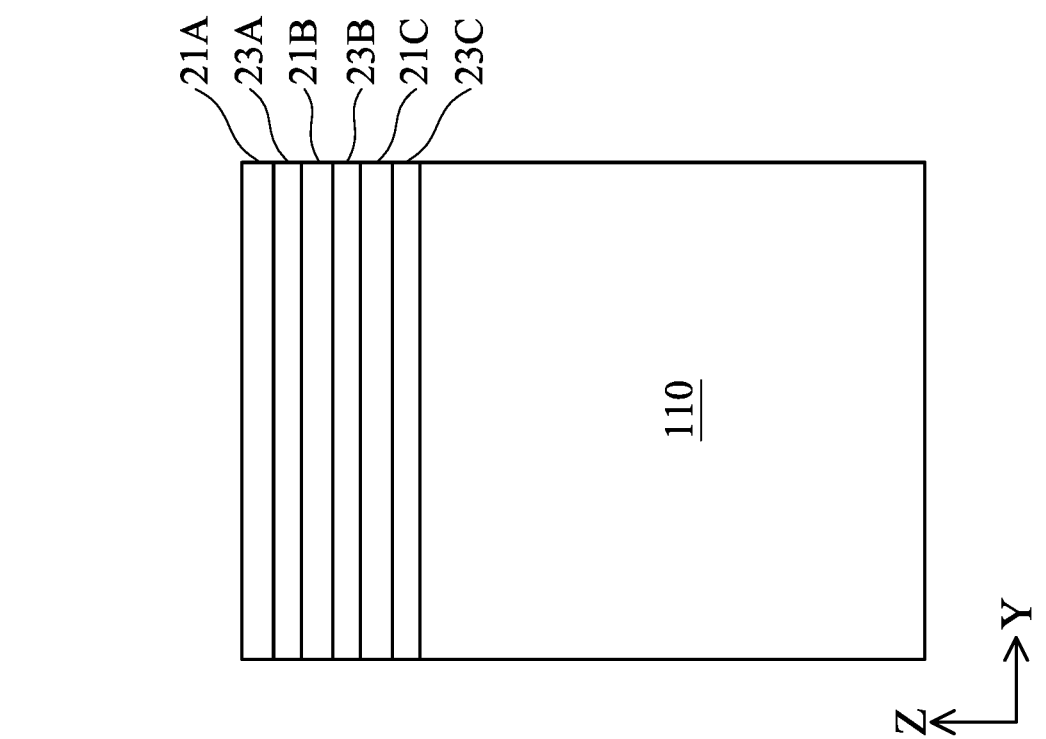
Figure 2A:
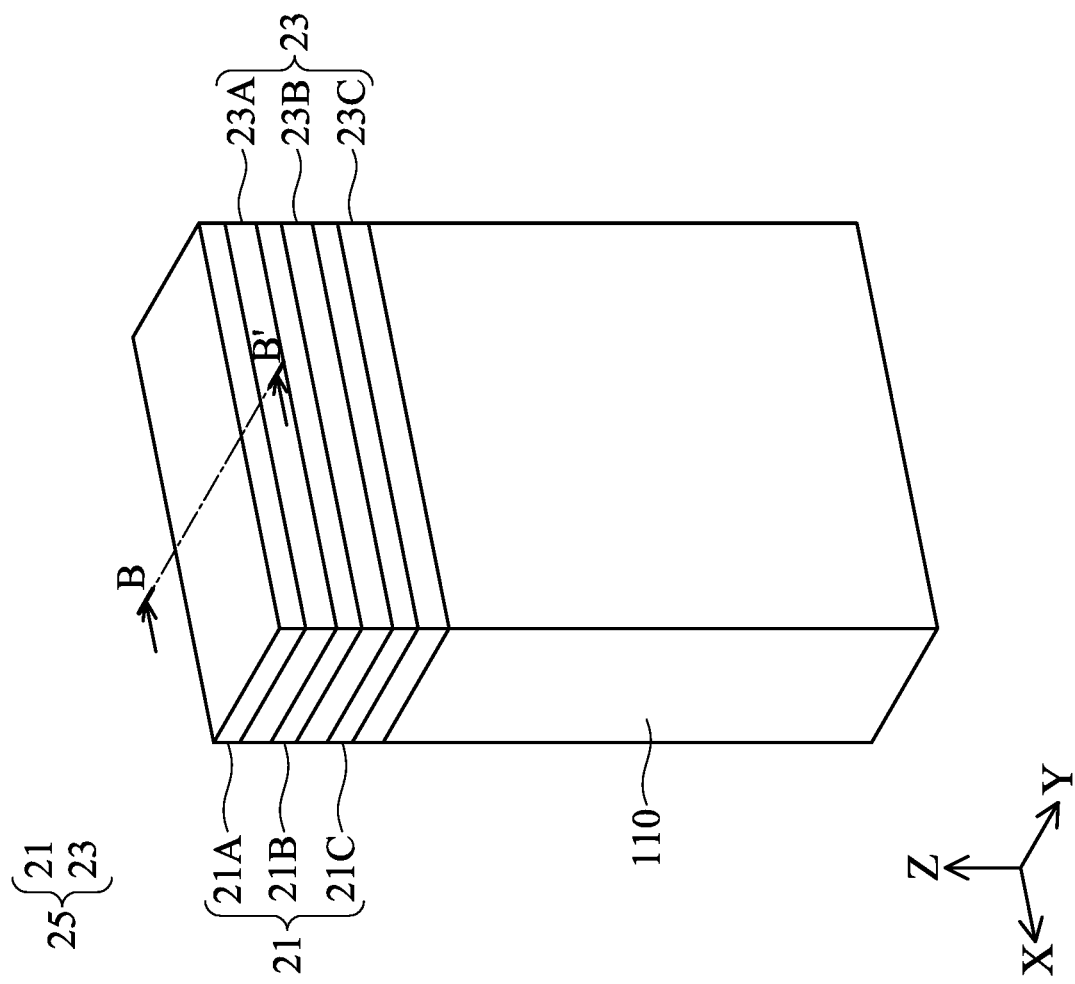

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A-21C (collectively referred to as first semiconductor layers 21) and second semiconductor layer stacks 23A-23C (collectively referred to as second semiconductor layer stacks 23). In some embodiments, the first semiconductor layers 21 may be formed of a first semiconductor material suitable for n-type nano-FETs, such as silicon, silicon carbide, or the like, and the second semiconductor layer stacks 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layer stacks 23 are illustrated. In some embodiments, the multi-layer stack 25 may include one or two each or four or more each of the first semiconductor layers 21 and the second semiconductor layer stacks 23. Although the multi-layer stack 25 is illustrated as including a second semiconductor layer 23C as the bottommost layer, in some embodiments, the bottommost layer of the multi-layer stack 25 may be a first semiconductor layer 21.

The first semiconductor materials and the second semiconductor materials may be chosen to have high etch selectivity to each other. The high etch selectivity allows the second semiconductor layer stacks 23 of the second semiconductor material to be removed without significantly removing the first semiconductor layers 21 of the first semiconductor material, thereby allowing the first semiconductor layers 21 to be patterned to form channel regions of nano-FETs. In conventional approaches, thermal processes cause intermixing of the first semiconductor materials and the second semiconductor materials at interfaces between the first semiconductor materials and the second semiconductor materials. As such, the intermixing can lead to germanium residue in silicon nanosheets, which causes potentially undesirable lower mobility and positive shift in threshold voltage.

Figure 2C:
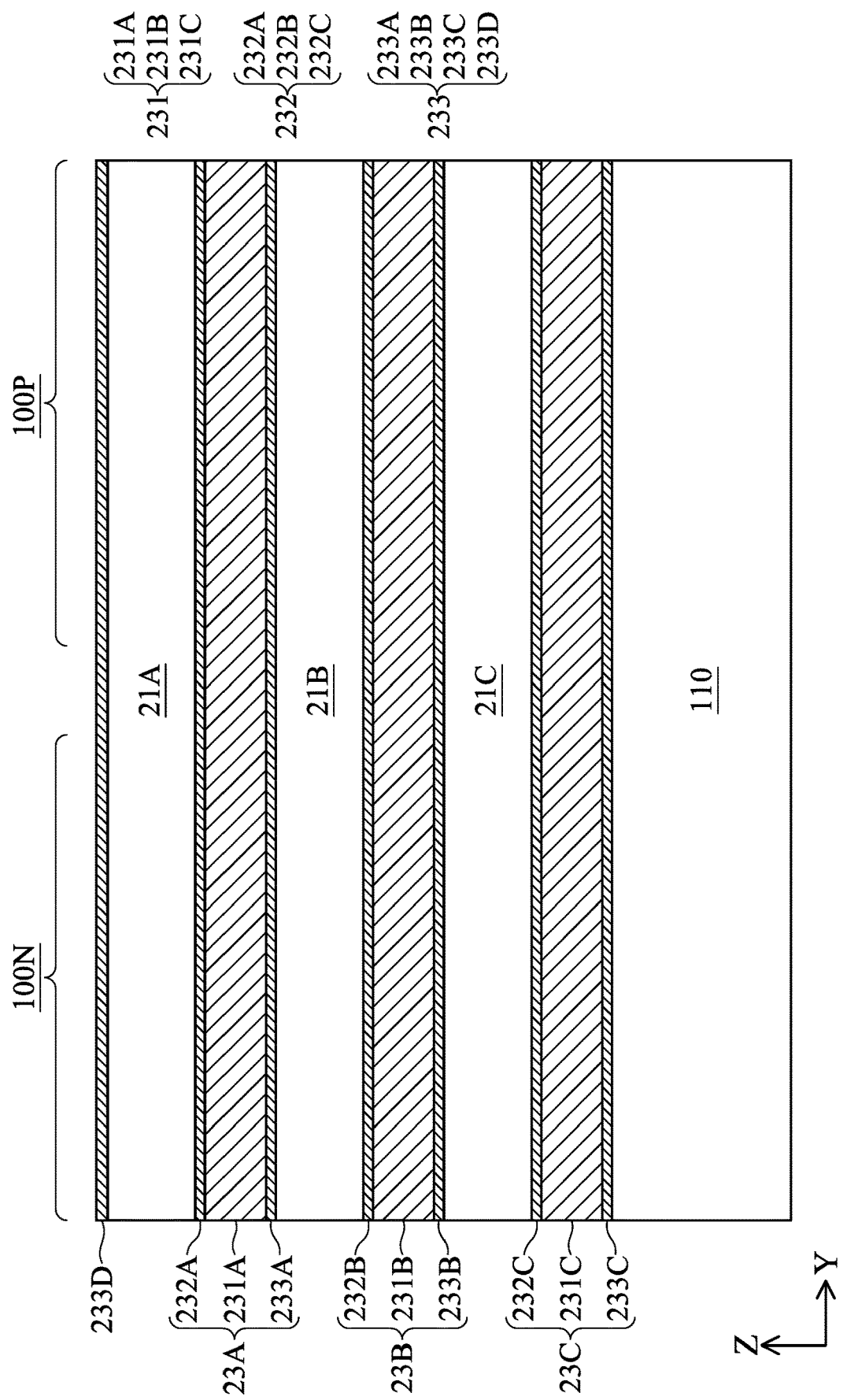

Referring to FIG. 2C, each second semiconductor layer stack 23 includes a high-concentration SiGe layer 231 stacked between a topside low-concentration SiGe layer 232 and an underside low-concentration SiGe layer 233. For example, the second semiconductor layer stack 23B includes the high-concentration SiGe layer 231B stacked between the topside low-concentration SiGe layer 232B and the underside low-concentration SiGe layer 233B. In some embodiments, an additional low-concentration SiGe layer 233D is formed atop the topmost first semiconductor layer 21A. The high-concentration SiGe layers 231 have germanium atomic percent (concentration) higher than in the low-concentration SiGe layers 232, 233, such as in a range of about 20% to about 40%. The high-concentration SiGe layers 231 ensure breakthrough during nanosheet formation, and the low-concentration SiGe layers 232, 233 significantly reduce or eliminate intermixing of silicon in the silicon nanosheets 21A with germanium that would normally occur if the low-concentration SiGe layers 232, 233 were not present. Below about 20% germanium concentration in the high-concentration SiGe layers 231 may lead to incomplete breakthrough in nanosheet formation, which is undesirable in many aspects (e.g., at least threshold voltage shift, gate fill window, channel separation). The low-concentration SiGe layers 232, 233 have germanium atomic percent (concentration) lower than in the high-concentration SiGe layers 231, such as in a range of about 10% to about 25%. Germanium concentration greater than 25% in the low-concentration SiGe layers 232, 233 may also cause undesirable effects, such as heavy intermixing of Ge with Si in the first semiconductor layers 21. In some embodiments, the germanium concentration in the high-concentration SiGe layers 231 is greater than the germanium concentration in the low-concentrations SiGe layers by at least about 5%.

In some embodiments, each second semiconductor layer stack 23 is formed by a single, continuous epitaxial growth process in which constituent gasses are mixed in varying ratios to form first the underside low-concentration SiGe layer 233, followed by the high-concentration SiGe layer 231, followed by the topside low-concentration SiGe layer 232. In some embodiments, each of the underside low-concentration SiGe layers 233, each of the high-concentration SiGe layers 231, and each of the topside low-concentration SiGe layers 232 is formed in an individual epitaxial growth process. The epitaxial growth can use CVD, MOCVD, MBE, LPE, VPE, UHVCVD, or the like, or a combination thereof. By way of example, precursor gases that can be used for the growth of the SiGe layers include silane (SiH4), disilane (Si2H6), germane (GeH4), digermane (Ge2H6), dichlorosilane (SiH2Cl2), any other suitable gas, or combinations thereof. In some embodiments, each or individual epitaxial growth processes are performed in the presence of hydrogen (H2) gas. In some embodiments, each low-concentration SiGe layer 232, 233 is formed to have germanium atomic percent (concentration) in a range of about 10% to about 25% by mixing a first germanium precursor (e.g., GeH4) and a first silicon precursor (e.g., Si2H6) in a first ratio (e.g., GeH4/Si2H6). In some embodiments, each high-concentration SiGe layer 231 is formed to have germanium atomic percent (concentration) higher than in the low-concentration SiGe layers 232, 233, such as in a range of about 20% to about 40%. As such, a second ratio of the first germanium precursor to the first silicon precursor used for forming the high-concentration SiGe layers 231 is higher than the first ratio used for forming the low-concentration SiGe layers 232, 233.

Taking the second semiconductor layer stack 23A for purposes of illustration, following growth of the first semiconductor layer 21B, a first epitaxial growth process is performed using the first germanium precursor and the first silicon precursor in the first ratio for a first duration to form the underside low-concentration SiGe layer 233A. A second epitaxial growth process, which may follow immediately after the first epitaxial growth process, is performed using the second ratio for a second duration to form the high-concentration SiGe layer 231A. A third epitaxial growth process, which may follow immediately after the second epitaxial growth process, is performed using a third ratio for a third duration to form the topside low-concentration SiGe layer 232A. In some embodiments, the third ratio is substantially the same as the first ratio (e.g., within <5% variation). In some embodiments, the third duration is substantially the same as the first duration (e.g., within <5% variation). As such, the topside low-concentration SiGe layer 232A has substantially the same characteristics (thickness, Ge concentration) as the underside low-concentration SiGe layer 233A. In some embodiments, the second ratio is higher than the first and third ratios, such that the germanium concentration in the high-concentration SiGe layers 231 is greater than the germanium concentration in the low-concentrations SiGe layers by at least about 5%. In some embodiments, the second duration is longer than the first and third durations, such that the high-concentration SiGe layer 231A is thicker than the topside and underside low-concentration SiGe layers 232A, 233A by a multiple in a range of about 2.5 to about 10. Above about 10, the low-concentration SiGe layers 232, 233 may be insufficiently thick to prevent intermixing from the high-concentration SiGe layers 231 to the first semiconductor layers 21. Below about 2.5, the high-concentration SiGe layers 231 may be insufficiently thick to provide adequate separation between the nanosheets 225A-225C and/or provide adequate breakthrough during nanosheet formation.

FIG. 2C illustrates a first region 100N and a second region 100P of the substrate 110. In some embodiments, the first region 100N is a region of the substrate 110 in and/or on which NFET devices are formed. In some embodiments, the second region 100P is a region of the substrate 110 in and/or on which PFET devices are formed. While shown as neighboring (adjacent) regions in FIG. 2C, the first region 100N and the second region 100P may also be separated by a distance or number of fins.

In FIG. 3A and FIG. 3B, fins 32 are formed in the substrate 110 and nanostructures 225, 24 are formed in the multi-layer stack 25 corresponding to act 1100 of FIG. 11. In some embodiments, the nanostructures 225, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 225A-225C (also referred to as "nanosheets") are formed from the first semiconductor layers 21, and second nanostructures 24A-24C are formed from the second semiconductor layers 23. Distance CD1 between adjacent fins 32 and nanostructures 225, 24 may be from about 18 nm to about 100 nm.

The fins 32 and the nanostructures 225, 24 may be patterned by any suitable method. For example, one or more photolithography processes, including double-patterning or multi-patterning processes, may be used to form the fins 32 and the nanostructures 225, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 225, 24 continuously increases in a direction towards the substrate 110. In such embodiments, each of the nanostructures 225, 24 may have a different width and be trapezoidal in shape. In other embodiments, the sidewalls are substantially vertical (non-tapered), such that width of the fins 32 and the nanostructures 225, 24 is substantially similar, and each of the nanostructures 225, 24 is rectangular in shape.

In FIGS. 3A and 3B, isolation regions 36, which may be shallow trench isolation (STI) regions, are formed adjacent the fins 32. The isolation regions 36 may be formed by depositing an insulation material over the substrate 110, the fins 32, and the nanostructures 225, 24, and between adjacent fins 32 and nanostructures 225, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 225, 24. Thereafter, a fill material, such as those discussed above may be formed over the liner. In some embodiments, after deposition of the insulation material, a thermal process, such as an anneal operation, may be performed, for example, to improve the quality of the insulation material. In some embodiments, the insulation material (and subsequently formed isolation regions 36) may include a multi-layer structure, for example, having one or more liner layers.

The insulation material undergoes a removal process, such as a chemical mechanical polish (CMP), an etch-back process, combinations thereof, or the like, to remove excess insulation material over the nanostructures 225, 24. Top surfaces of the nanostructures 225 may be exposed and level with the insulation material after the removal process is complete.

The insulation material is then recessed to form the isolation regions 36. After recessing, the nanostructures 225, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 recessed by an acceptable etching process, such as an oxide removal using, for example, dilute hydrofluoric acid (dHF), which is selective to the insulation material and leaves the fins 32 and the nanostructures 225, 24 substantially unaltered.

FIGS. 2A through 3B illustrate one embodiment (e.g., etch last) of forming the fins 32 and the nanostructures 225, 24. In some embodiments, the fins 32 and/or the nanostructures 225, 24 are epitaxially grown in trenches in a dielectric layer. The epitaxial structures may comprise the alternating semiconductor materials discussed above, such as the first semiconductor materials and the second semiconductor materials.

Further in FIG. 3A and FIG. 3B, appropriate wells (not separately illustrated) may be formed in the fins 32, the nanostructures 225, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the semiconductor layers 21, 23 may obviate separate implantations, although in situ and implantation doping may be used together.

Figure 3C:
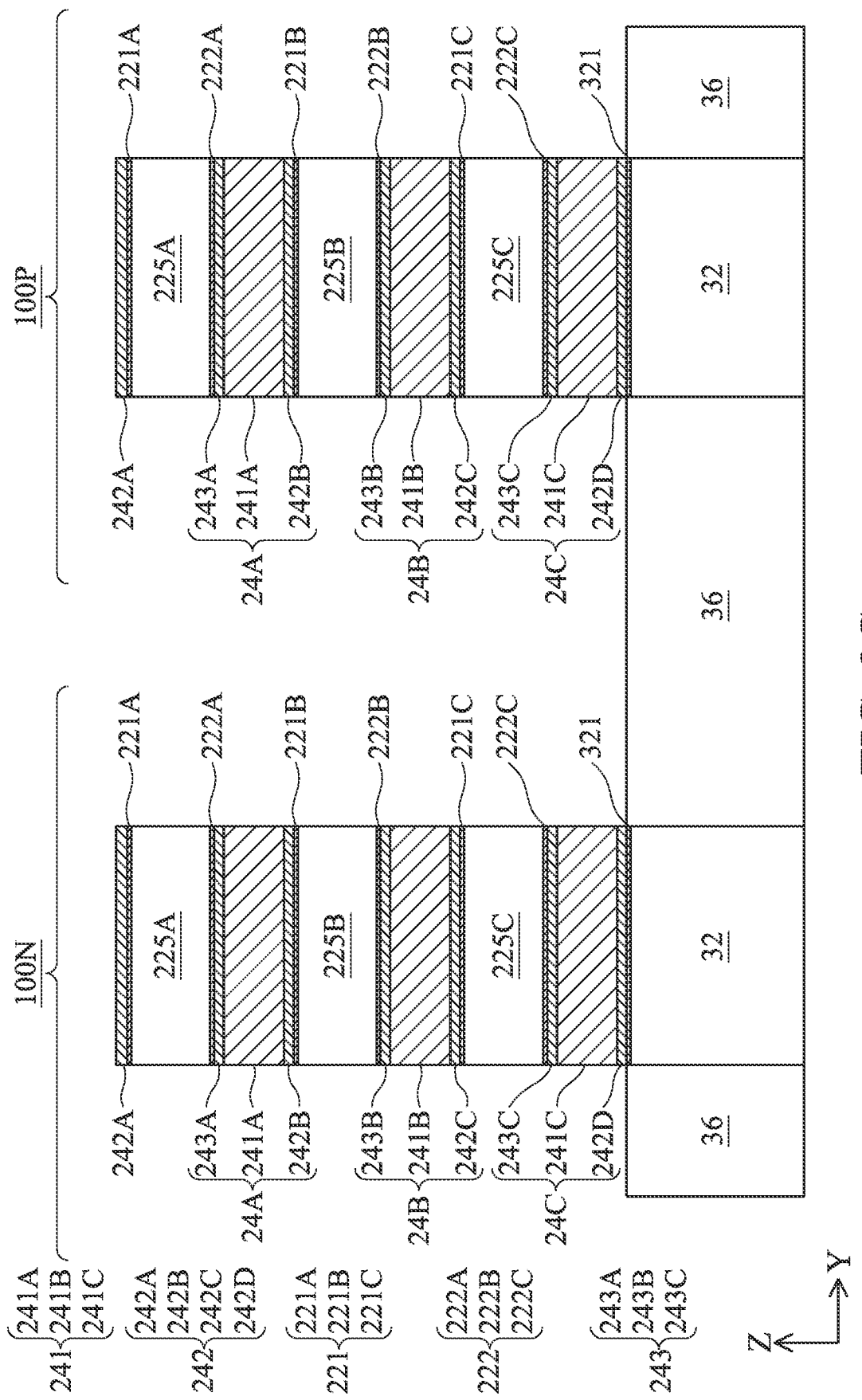

Referring to FIG. 3C, following fin formation and isolation region formation, as described above in relation to FIGS. 3A and 3B, the first semiconductor layers 21 are patterned to form the nanosheets 225. The topside low-concentration SiGe layers 232A-232C are patterned to form the underside low-concentration SiGe layers 243A-243C corresponding to the nanosheets 225A-225C, respectively. The underside low-concentration SiGe layers 233A, 233B are patterned to form the topside low-concentration SiGe layers 242B, 242C corresponding to the nanosheets 225B, 225C. The low-concentration SiGe layer 233D is patterned to form the topside low-concentration SiGe layers 242A corresponding to the nanosheets 225A. The low-concentration SiGe layer 233C is patterned to form the topside low-concentration SiGe layers 242D corresponding to the fins 32.

Due to the thermal processes, for example, the anneal performed in isolation region formation and/or following impurity implant, each of the nanosheets 225A-225C may include topside and/or underside intermixing regions 221, 222. The fin 32 may also include a topside intermixing region 321. The topside and underside intermixing regions 221, 321, 222 may be collectively referred to as "intermixing regions." The intermixing regions 221, 321, 222 may be formed quite thin, e.g., 3-5 Angstroms, compared to conventional processes, as a result of the relatively thin low-concentration SiGe layers 232, 233 having Ge concentration between about 10% and about 25%. Furthermore, concentration of Ge in the intermixing regions 221, 321, 222 may be less than about 5%. In some embodiments, the intermixing regions 221, 321, 222 are substantially free of Ge, e.g., having Ge concentration less than about 0.1%. Ge concentration in the intermixing regions 221, 321, 222 greater than about 5% may cause an undesirable shift in threshold voltage in the GAA device 20N.

In FIGS. 4A-4C, dummy gate structures 40 are formed over the fins 32 and/or the nanostructures 225, 24, corresponding to act 1200 of FIG. 11. A dummy gate layer 45 is formed over the fins 32 and/or the nanostructures 225, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer (not illustrated for simplicity) is formed before the dummy gate layer 45 between the dummy gate layer 45 and the fins 32 and/or the nanostructures 225, 24.

A spacer layer 41 is formed over sidewalls of the mask layer 47 and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments.

In FIGS. 5A-5C, an etching process is performed to etch the portions of protruding fins 32 and/or nanostructures 225, 24 that are not covered by dummy gate structures 40, resulting in the structure shown. The recessing may be anisotropic, such that the portions of the fins 32 directly underlying the dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments.

FIGS. 6A-6D and 7A-7D illustrate formation of inner spacers 74 corresponding to act 1300 of FIG. 11. Generally, a selective etching process is performed to recess end portions of the nanostructures 24 exposed by openings in the spacer layer 41 without substantially attacking the nanostructures 225, as shown in FIG. 6C. After the selective etching process, recesses 64 are formed in the nanostructures 24 at locations where the removed end portions used to be. The resulting structure is shown in FIGS. 6A-6C.

Referring to FIG. 6D, an enlarged view showing detailed structure of the recesses 64 is shown. Each of the recesses 64 is located either between vertically neighboring nanosheets 225, e.g., between the nanosheet 225A and the nanosheet 225B, or between the fin 32 and the nanosheet 225 closest the fin 32, e.g., the nanosheet 225C as shown in FIG. 6D. The fins 32, the nanosheets 225, the low-concentration SiGe layers 242, 243, and the high-concentration SiGe layers 241 each have different etching selectivity due to their differing Ge concentrations. The high-concentration SiGe layers 241 are etched the fastest, followed by the low-concentration SiGe layers 242, followed by the fins 32 and the nanosheets 225, which may be substantially unetched due to being substantially free of Ge, or may be etched only slightly at the intermixing regions 221, 222, 321 when present. As such, the high-concentration SiGe layers 241 are etched to a first depth W1, corresponding to lateral distance between an outer sidewall of the nanosheet 225 and an outer sidewall of the high-concentration SiGe layer 241. The low-concentration SiGe layers 242, 243 are etched to second depths W2, W3, respectively, corresponding to lateral distance between the outer sidewall of the nanosheet 225 and an outer sidewall of the low-concentration SiGe layer 242, 243, respectively. In some embodiments, the second depths W2, W3 are substantially the same, due to the low-concentration SiGe layers 242, 243 having substantially the same Ge concentration. In some embodiments, the second depths W2, W3 are smaller than the first depth W1 due to the low-concentration SiGe layers 242, 243 having lower Ge concentration than the high-concentration SiGe layers 241. In some embodiments, the first depth W1 is larger than the second depths W2, W3 by a multiple of at least 1.5. In some embodiments, the outer sidewalls of the high-concentration SiGe layers 241 are planar, convex, concave, or another shape due to characteristics of the recessing operation that forms the recesses 64.

Next, an inner spacer layer is formed to fill the recesses 64 in the nanostructures 24 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses 64 in the nanostructures 24) form the inner spacers 74. The resulting structure is shown in FIGS. 7A-7C.

Figure 7D:
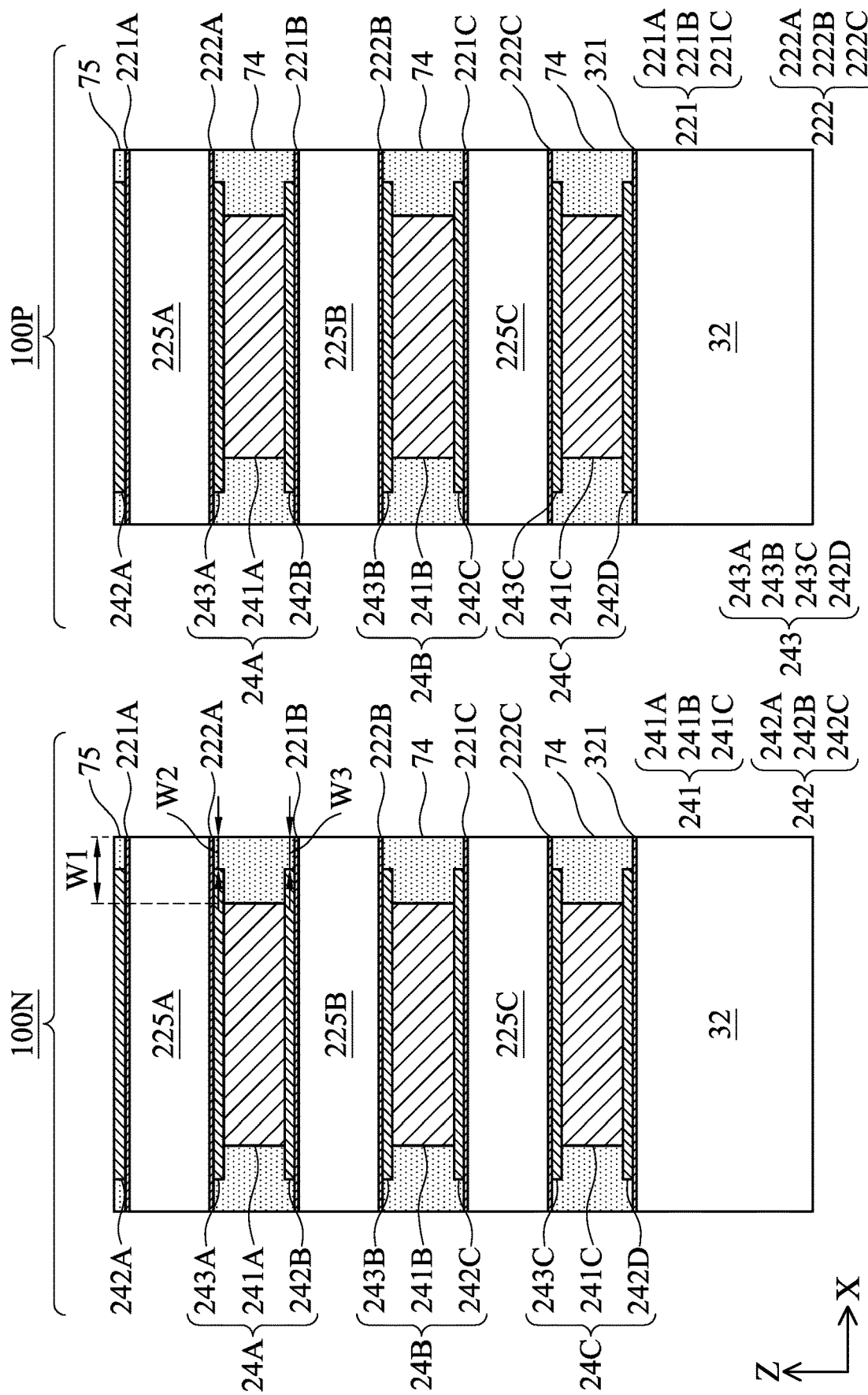

Referring to FIG. 7D, an enlarged view showing detailed structure of the inner spacers 74 and top layer spacers 75 is shown. The inner spacers 74 have generally the same lateral dimensions as the recesses 64 shown in FIG. 6D. While the inner spacers 74 are typically grown in a single process, and have no discernable interface internally, geometry of the inner spacers 74 may be conveniently described in two portions: an inner portion and an outer portion. The inner portion of each inner spacer 74 may physically contact outer sidewalls of the high-concentration SiGe layers 241, bottom surfaces of the low-concentration SiGe layers 242, and top surfaces of the low-concentration SiGe layers 243. Width of the inner portion of the inner spacers 74 may be equal to W1-W2, W1-W3, or W1 minus the average of W2 and W3, for example. The outer portion of each inner spacer 74 may physically contact the bottom surface of the nanosheets 225, the outer sidewalls of the low-concentration SiGe layers 242, 243, and the top surface of either the nanosheets 225 or the fin 32. The outer portion of each inner spacer 74 may further physically contact an inner sidewall of the epitaxial source/drain regions 82 (see FIG. 1, for example).

In embodiments including the low-concentration SiGe layers 242D above the topmost nanosheet, e.g., the nanosheet 225A shown in FIG. 7D, top layer spacers 75 may be formed due to recessing of the low-concentration SiGe layer 242A that occurs while forming the openings 64 of FIGS. 6A-6D. Top surfaces of the top layer spacers 75 may be in physical contact with bottom surfaces of the gate spacers 41 (not shown in FIG. 7D for simplicity). Inner sidewalls of the top layer spacers 75 may be in physical contact with the outer sidewalls of the low-concentration SiGe layers 242A. Outer sidewalls of the top layer spacers 75 may be in physical contact with the inner sidewalls of the epitaxial source/drain regions 82. Bottom surfaces of the top layer spacers 75 may be in physical contact with the top surfaces of the nanosheets 225A.

FIGS. 8A-8C illustrate formation of the source/drain regions 82 corresponding to act 1400 of FIG. 11. In the illustrated embodiment, the source/drain regions 82 are epitaxially grown from epitaxial material(s). In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth. A contact etch stop layer (CESL) and interlayer dielectric (ILD), not illustrated for simplicity, may then be formed covering the dummy gate structures 40 and the source/drain regions 82.

FIG. 9A, FIG. 9B, and FIG. 9C illustrate release of fin channels 22A-22C by removal of the high-concentration SiGe layers 241, the mask layer 47, and the dummy gate layer 45, which corresponds to act 1500 of FIG. 11. A planarization process, such as a CMP, is performed to level the top surfaces of the dummy gate layer 45 and gate spacer layer 41. The planarization process may also remove the mask layer 47 (see FIG. 8A) on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric, when present, may be used as an etch stop layer when the dummy gate layer 45 is etched. The dummy gate dielectric may then be removed after the removal of the dummy gate layer 45.

The high-concentration SiGe layers 241 are removed to release the nanostructures 22. In some embodiments, the high-concentration SiGe layers 241 are removed by a selective etching process using an etchant that is selective to the material of high-concentration SiGe layers 241, such that the high-concentration SiGe layers 241 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like. After the high-concentration SiGe layers 241 are removed, the nanostructures 22 extend horizontally (e.g., parallel to a major upper surface of the substrate 110). Various configurations of the nanostructures 22 are illustrated in enlarged views shown in FIGS. 9D-9F.

Figure 9E:
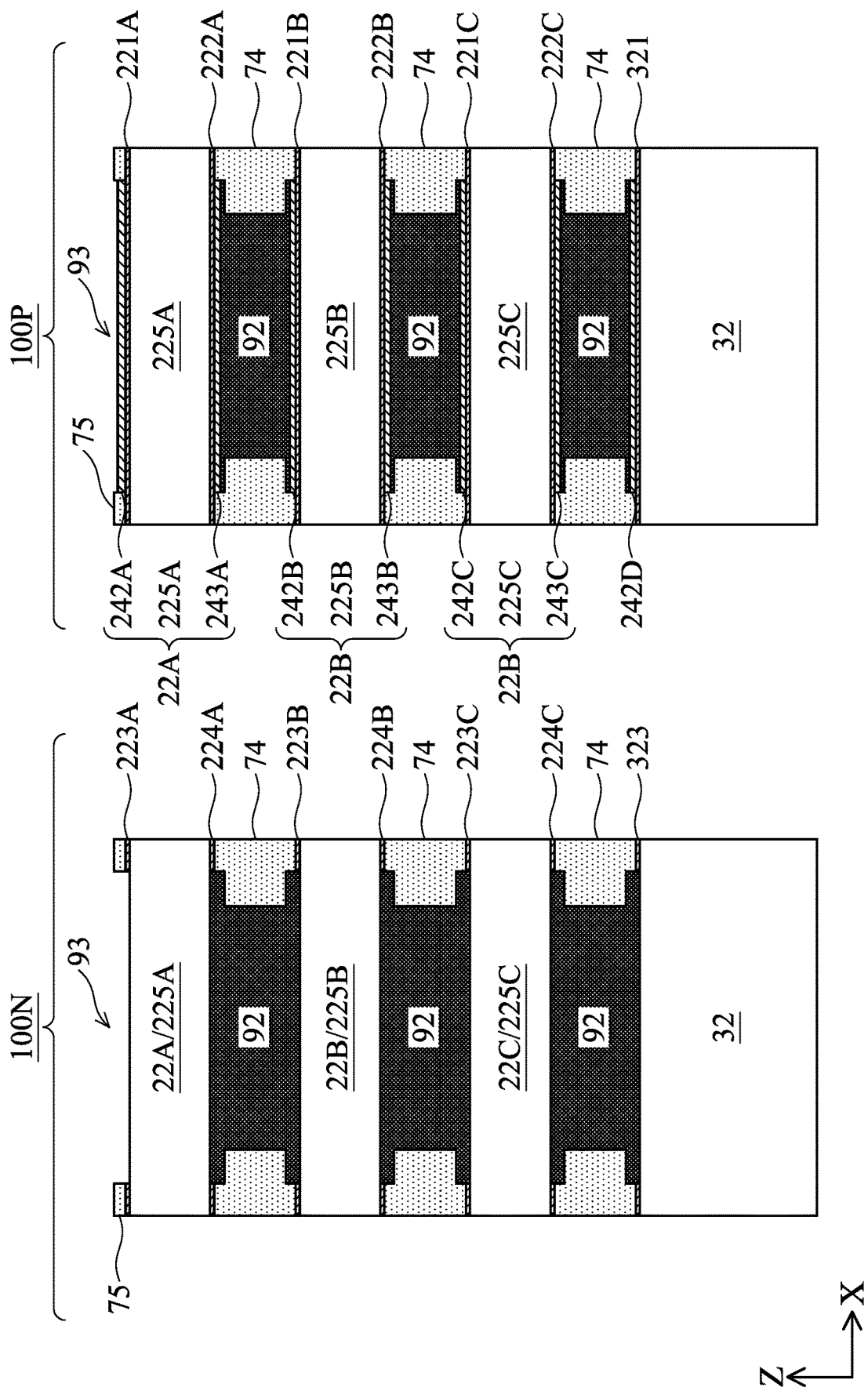
Figure 9F:
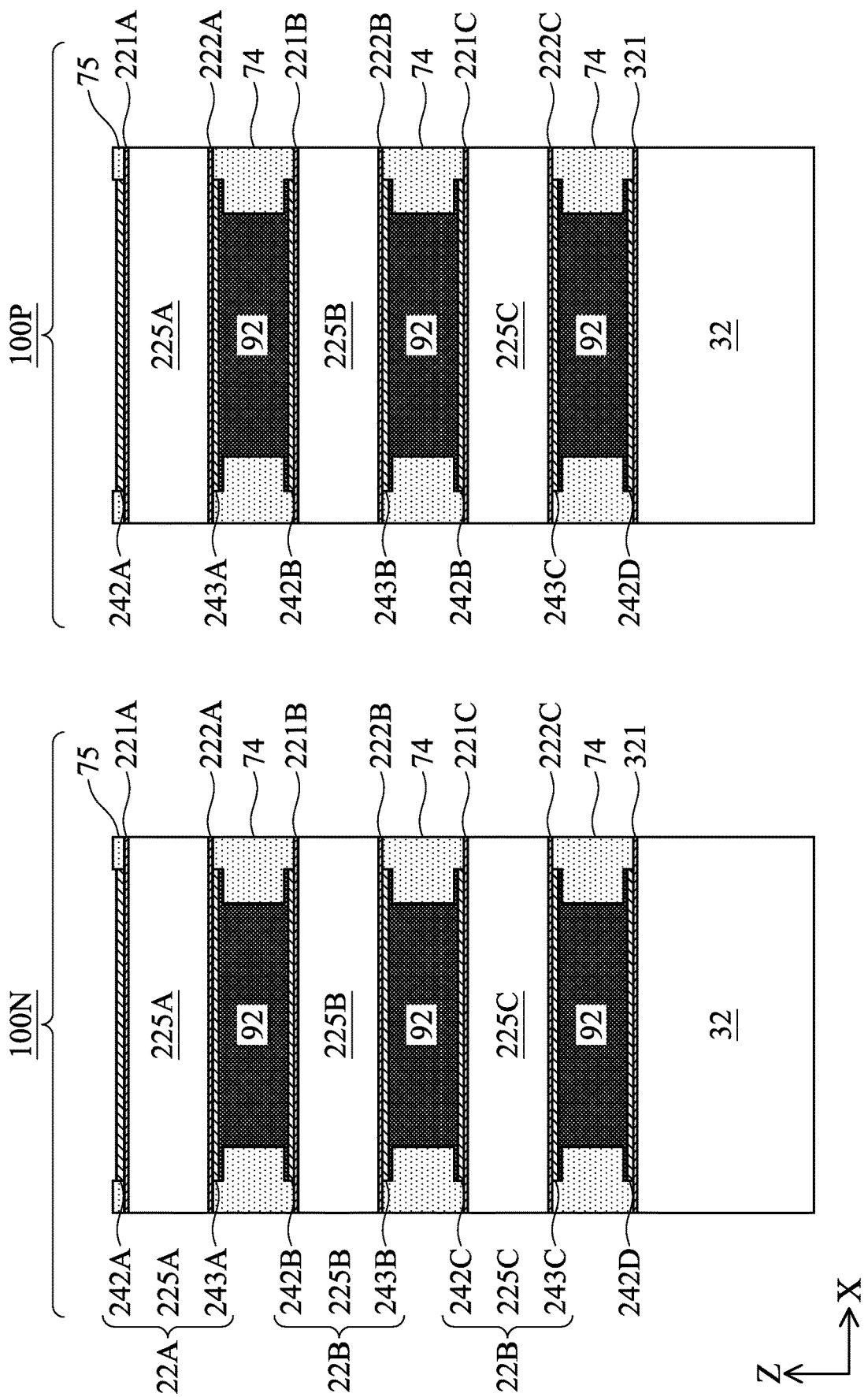
Figure 10D:
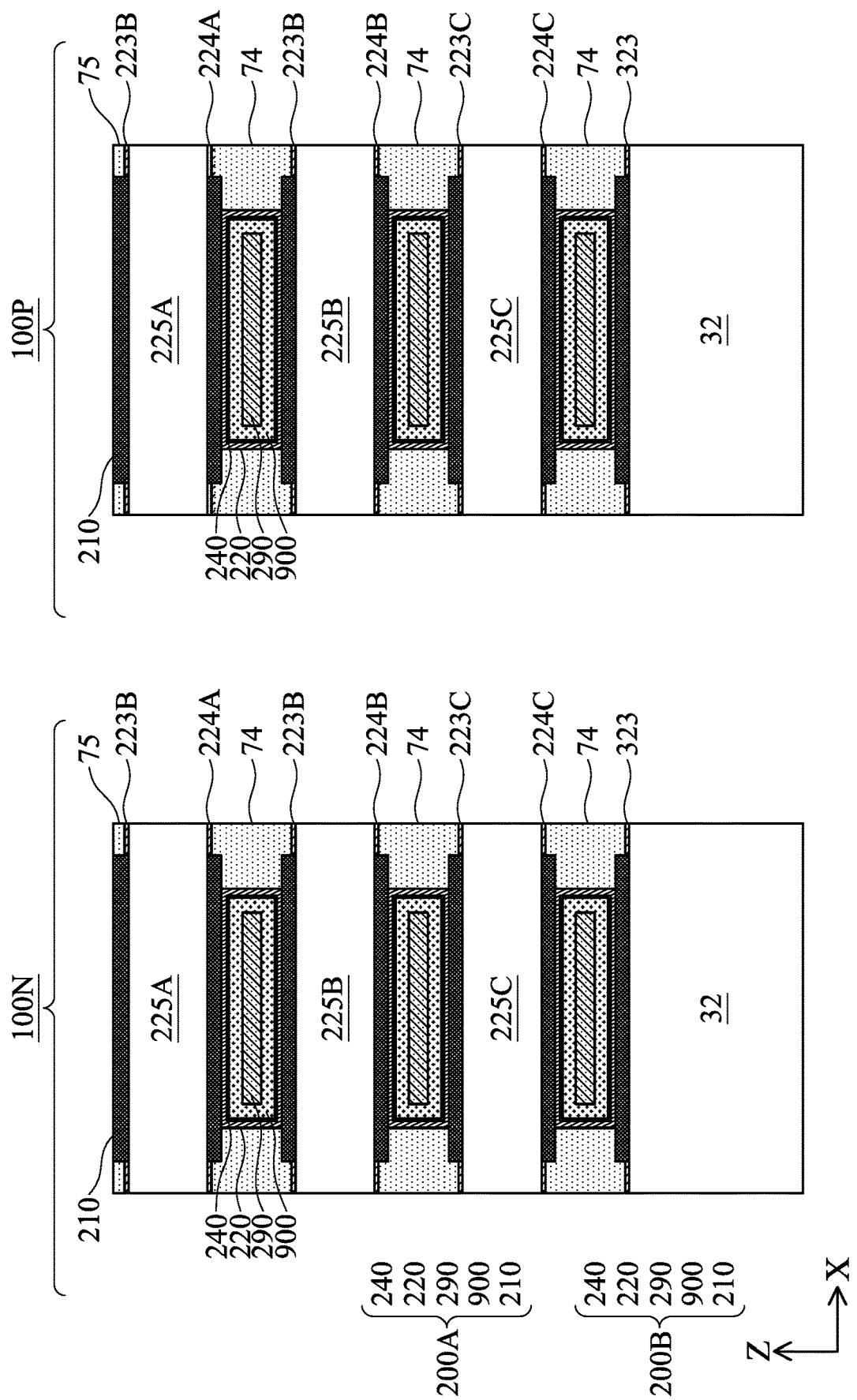
Figure 10E:
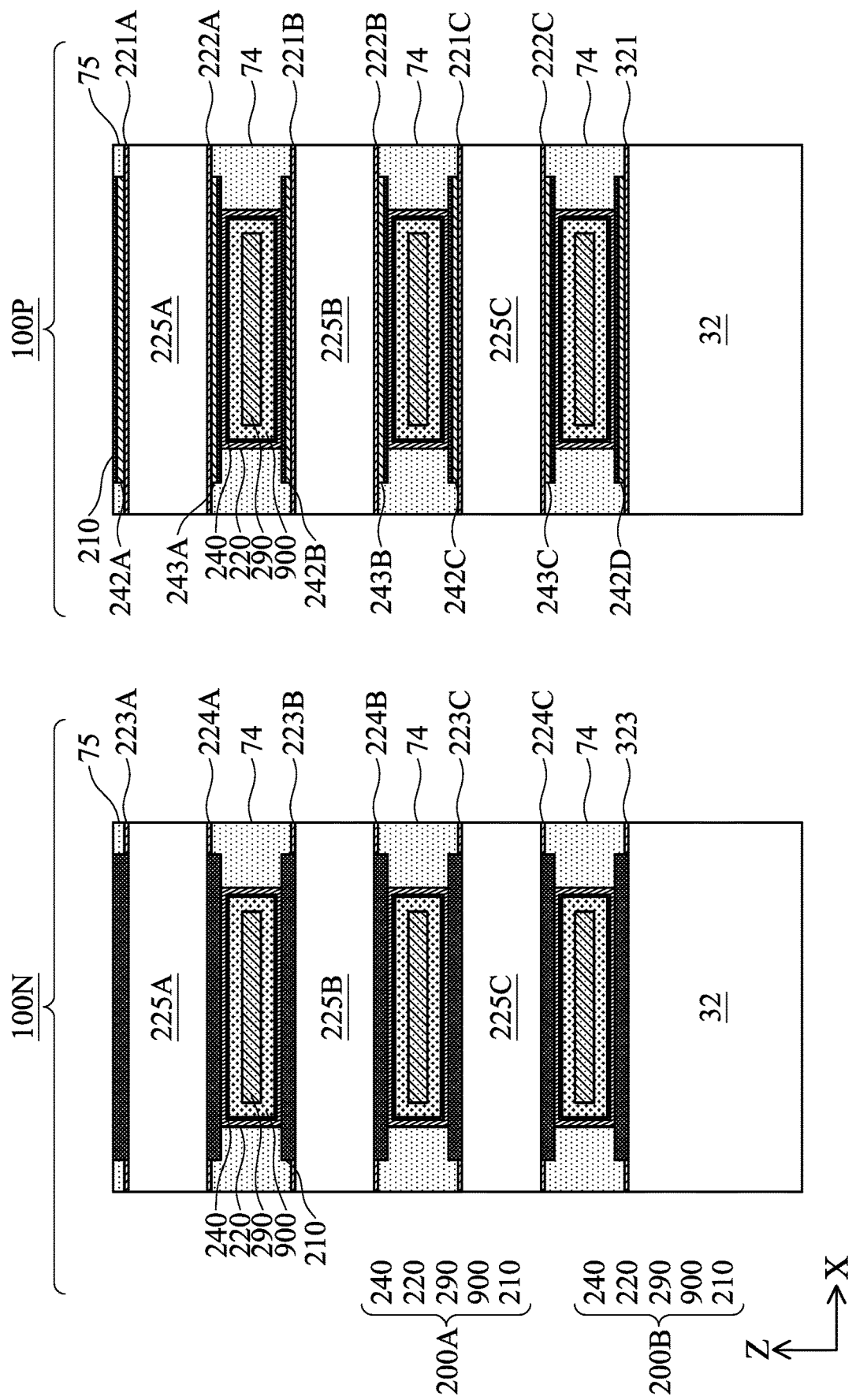
Figure 10F:
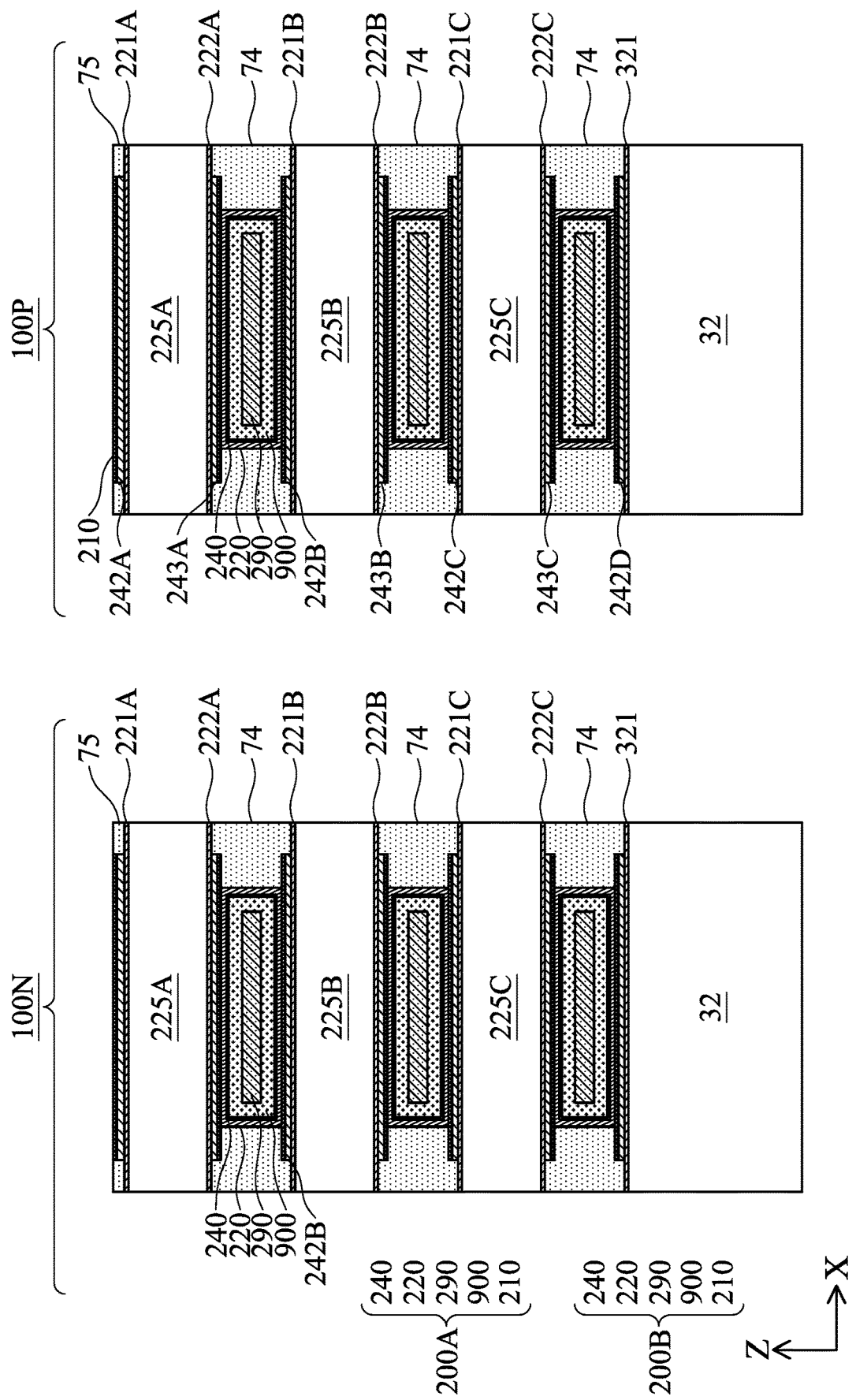

Referring to FIGS. 9D-9F, in some embodiments, the low-concentration SiGe layers 242, 243 are removed, corresponding to act 1600 of FIG. 11. As shown in FIG. 9D, the removal may be performed in both the first region 100N and the second region 100P. Removal of the low-concentration SiGe layers 242, 243 is accomplished, in some embodiments, by a trimming process that oxidizes the SiGe material of the low-concentration SiGe layers 242, 243, followed by an oxide removal process to remove the oxidized SiGe material. In some embodiments, the trimming process further oxidizes exposed portions of the intermixing regions 221, 222, and the oxidized portions of the intermixing layers 221, 222 are also removed, such that partial intermixing regions 223, 224 remain. The partial intermixing regions 223, 224 are generally laterally aligned with the outer portions of the inner spacers 74, as shown in FIG. 9D. Removal of the low-concentration SiGe layers 242, 243 and optionally the exposed portions of the intermixing regions 221, 222 reduces or eliminates positive threshold voltage shift in the GAA devices 20N, 20P. This may be desirable for PFETs with higher threshold voltage (magnitude), e.g., PFET IO transistors, and for NFETs with lower threshold voltage (magnitude), e.g., NFET core logic transistors.

Referring to FIG. 9E, in some embodiments, the low-concentration SiGe layers 242, 243 are removed only in the first region 100N, and are present in the second region 100P. Devices in the second region 100P may be covered by a mask, such as a photoresist mask, while devices in the first region 100N are exposed by the mask, during the oxidation and removal processes described above with respect to FIG. 9D. Removal of the low-concentration SiGe layers 242, 243 and optionally the exposed portions of the intermixing regions 221, 222 as described with respect to FIG. 9D reduces or eliminates positive threshold voltage shift in the GAA devices 20N. The presence of the low-concentration SiGe layers 242, 243 in the second region 100P positively shifts the threshold voltage in the GAA devices 20P. This may be desirable for PFETs with lower threshold voltage (magnitude), e.g., PFET core logic transistors, and for NFETs with lower threshold voltage (magnitude), e.g., NFET core logic transistors.

Referring to FIG. 9F, in some embodiments, the low-concentration SiGe layers 242, 243 are present (not removed) in both the first region 100N and the second region 100P. As such, the positive shift in the threshold voltage is present in the GAA devices 20N, 20P. This may be desirable for PFETs with lower threshold voltage (magnitude), e.g., PFET core logic transistors, and for NFETs with higher threshold voltage (magnitude), e.g., NFET IO transistors.

An IC device may include NFETs with low threshold voltage, NFETs with high threshold voltage, PFETs with low threshold voltage, and PFETs with high threshold voltage. As such, the techniques described with respect to FIGS. 9D-9F can be combined, in some embodiments. First transistors for which the positive threshold voltage shift is desirable, such as PFET core logic transistors and NFET IO transistors, may be masked during the trimming process, so that the low-concentration SiGe layers 242, 243 are present in the first transistors. Second transistors for which the positive threshold voltage shift is not desirable, such as PFET IO transistors and NFET core logic transistors, may be exposed during the trimming process to remove the low-concentration SiGe layers 242, 243. In some embodiments, a partial trim that merely thins, but does not remove entirely, the low-concentration SiGe layers 242, 243 may be employed to achieve a partial positive threshold voltage shift, such that three different threshold voltages may be achieved for each of the NFETs and the PFETs.

In some embodiments, when the nanosheets 225 of the GAA device 20N and/or the GAA device 20P are exposed following the trimming process, the nanosheets 225 are further reshaped (e.g. thinned) by another etching process to improve gate fill window. The reshaping may be performed by an isotropic etching process selective to the nanosheets 225. After reshaping, the nanosheets 225 may exhibit the dog bone shape in which middle portions of the nanosheets 225 are thinner than peripheral portions of the nanosheets 225.

Next, in FIGS. 10A-10F, replacement gates 200, such as the gate structures 200A, 200B, are formed, corresponding to act 1700 of FIG. 11. Each replacement gate 200 generally includes the first IL layer 210, the gate dielectric layer 220, the second IL layer 240, the work function metal layer 900, and the gate fill layer 290, as described with respect to FIG. 1.

Additional processing may be performed to finish fabrication of the GAA device 20N and/or the GAA device 20P. For example, gate contacts (not illustrated for simplicity) and the source/drain contacts 120 may be formed to electrically couple to the gate structures 200A-200B and the source/drain regions 82, respectively, corresponding to act 1800 of FIG. 11. An interconnect structure may then be formed over the source/drain contacts 120 and the gate contacts. The interconnect structure may include a plurality of dielectric layers surrounding metallic features, including conductive traces and conductive vias, which form electrical connection between devices on the substrate 110, such as the GAA devices 20N, 20P, as well as to IC devices external to the IC device 10.

Embodiments may provide advantages. The high-concentration SiGe layers 241 ensure breakthrough during sheet formation. The low-concentration SiGe layers 242, 243 reduce or eliminate intermixing between the silicon of the Si nanosheets 225 and the germanium of the SiGe nanosheet structures 24 during thermal processes, such as annealing. Selective trimming, such as by a SiGe oxidation process followed by oxide removal, may be performed to remove or keep the low-concentration SiGe layers 242, 243 depending on whether a positive shift in threshold voltage is desirable (keep) or not desirable (remove). This provides an additional lever for threshold voltage tuning in GAA devices, such as the GAA devices 20N, 20P.

In accordance with various embodiments, a device comprises a substrate; a first semiconductor channel over the substrate, comprising: a first nanosheet of a first semiconductor material; a second nanosheet of a second semiconductor material in physical contact with a topside surface of the first nanosheet; and a third nanosheet of the second semiconductor material in physical contact with an underside surface of the first nanosheet; and a first gate structure over and laterally surrounding the first semiconductor channel, and in physical contact with the second nanosheet and the third nanosheet.

In accordance with various embodiments, a method comprises forming a first multi-layer semiconductor stack on a substrate, comprising a first silicon germanium layer, a second silicon germanium layer, and a third silicon germanium layer; forming a silicon layer on the first multi-layer semiconductor stack; forming a second multi-layer semiconductor stack on the silicon layer, comprising a fourth silicon germanium layer, a fifth silicon germanium layer, and a sixth silicon germanium layer; forming a first semiconductor fin and a second semiconductor fin by patterning the first multi-layer semiconductor stack, the silicon layer, and the second multi-layer semiconductor stack; removing the second silicon germanium layer and the fifth silicon germanium layer of the first and second semiconductor fins by a first etching process that is more selective to the second and fifth silicon germanium layers than to the first, third, fourth and sixth silicon germanium layers; and forming a first gate structure in a first opening formed by the first etching process.

In accordance with various embodiments, a device comprises a first transistor on a substrate; and a second transistor on the substrate, comprising: a first silicon nanosheet; a second silicon nanosheet; a first silicon germanium layer physically contacting a major surface of the first silicon nanosheet facing the second silicon nanosheet; and a second silicon germanium layer physically contacting a major surface of the second silicon nanosheet facing the first silicon nanosheet.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first multi-layer semiconductor stack on a substrate, comprising a first silicon germanium layer, a second silicon germanium layer, and a third silicon germanium layer;
   forming a silicon layer on the first multi-layer semiconductor stack;

forming a second multi-layer semiconductor stack on the silicon layer, comprising a fourth silicon germanium layer, a fifth silicon germanium layer, and a sixth silicon germanium layer;

forming a first semiconductor fin and a second semiconductor fin by patterning the first multi-layer semiconductor stack, the silicon layer, and the second multi-layer semiconductor stack;

removing the second silicon germanium layer and the fifth silicon germanium layer of the first and second semiconductor fins by a first etching process that is more selective to the second and fifth silicon germanium layers than to the first, third, fourth and sixth silicon germanium layers; and forming a first gate structure in a first opening formed by the first etching process.

2. The method of claim 1, further comprising:
removing the first, third, fourth and sixth silicon germanium layers in the first semiconductor fin by an oxidizing process and a second etching process while the second semiconductor fin is masked;
wherein the first opening is formed by the first and second etching processes.

3. The method of claim 2, further comprising:
forming a second gate structure physically contacting the first, third, fourth and sixth silicon germanium layers of the second semiconductor fin.

4. The method of claim 1, wherein:
forming the first multi-layer stack comprises:
forming the first silicon germanium layer having a first germanium concentration;
forming the second silicon germanium layer physically contacting the first silicon germanium layer, the second silicon germanium layer having a second germanium concentration greater than the first germanium concentration; and
forming the third silicon germanium layer physically contacting the second germanium layer, the third silicon germanium layer having a third germanium concentration less than the second germanium concentration.

5. The method of claim 4, wherein:
the second germanium concentration is greater than the first germanium concentration by at least about 5%.

6. The method of claim 4, wherein:
the first germanium concentration is in a range of about 10% to about 25%;
the second germanium concentration is in a range of about 20% to about 40%; and
the third germanium concentration is in a range of about 10% to about 25%.

7. A method, comprising:
forming a first transistor of a first type, the first transistor including:
a first vertical stack of first nanostructure channels, each including a first layer of a first semiconductor material; and
a first gate structure in contact with the respective first layers of the first nanostructure channels; and
forming a second transistor of a second type different from the first type, the second transistor including:
a second vertical stack of second nanostructure channels, each including:
a second layer of the first semiconductor material; and
a third layer of a second semiconductor material different from the first semiconductor material;

a source/drain region laterally abutting the second nanostructure channels; and
a second gate structure in contact with the respective third layers of the second nanostructure channels, the second gate structure being vertically separated from the respective second layers by the respective third layers.

8. The method of claim 7, including:
forming a first multi-layer semiconductor stack on a substrate, comprising a first silicon germanium layer, a second silicon germanium layer, and a third silicon germanium layer.

9. The method of claim 8, wherein germanium concentration in the second silicon germanium layer is greater than that of the first silicon germanium layer by at least about 5%.

10. The method of claim 9, wherein:
the germanium concentration in the first silicon germanium layer is in a range of about 10% to about 25%; and
the germanium concentration in the second silicon germanium layer is in a range of about 20% to about 40%.

11. The method of claim 10, wherein the forming a first transistor includes:
removing portions of the first silicon germanium layer and the third silicon germanium layer overlapped by the first vertical stack.

12. The method of claim 10, wherein the forming a second transistor includes:
removing portions of the second silicon germanium layer overlapped by the first vertical stack.

13. A method, comprising:
forming a first silicon layer on a substrate;
forming a first silicon germanium layer on the first silicon layer;
forming a second silicon germanium layer on the first silicon germanium layer;
forming a third silicon germanium layer on the second silicon germanium layer;
forming a second silicon layer on the third silicon germanium layer;
forming a first vertical stack of first nanostructures and a second vertical stack of second nanostructures by patterning the first silicon germanium layer, the second silicon germanium layer, the third silicon germanium layer, and the silicon layer;
forming a first opening and a second opening by removing the second silicon germanium layer of the first and second vertical stacks by a first etching process that is more selective to the second silicon germanium layer than to the first and third silicon germanium layers, the first opening being associated with the first vertical stack, the second opening being associated with the second vertical stack; and
forming a first gate structure in the first opening and a second gate structure in the second opening.

14. The method of claim 13, comprising:
expanding the first opening by removing the first and third silicon germanium layers by a second etching process while the second opening is protected by a mask.

15. The method of claim 14, wherein the first gate structure is in contact with the first and second silicon layers, and the second gate structure is in contact with the first and third silicon germanium layers.

16. The method of claim 13, wherein germanium concentration in the second silicon germanium layer is higher than in the first silicon germanium layer and the third silicon germanium layer.

17. The method of claim 16, wherein germanium concentration in the second silicon germanium layer is greater than that in the first silicon germanium layer by at least about 5%.

18. The method of claim 17, wherein:
the germanium concentration in the first silicon germanium layer is in a range of about 10% to about 25%;
the germanium concentration in the second silicon germanium layer is in a range of about 20% to about 40%; and
germanium concentration in the third silicon germanium layer is in a range of about 10% to about 25%.

19. The method of claim 13, wherein the first gate structure has larger vertical dimension between the first and second silicon layers than the second gate structure has between the first and second silicon layers.

20. The method of claim 13, including:
forming an oxide of silicon germanium by oxidizing material of the first and third silicon germanium layers in the first opening while the second opening is masked; and
removing the oxide.

* * * * *